(12) United States Patent (10) Patent No.: US 12,575,364 B2
Ueno (45) Date of Patent: Mar. 10, 2026

(54) ABNORMALITY DETECTION DEVICE

(71) Applicant: SCREEN Holdings Co., Ltd., Kyoto (JP)

(72) Inventor: Tomohiro Ueno, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 509 days.

(21) Appl. No.: 18/086,304

(22) Filed: Dec. 21, 2022

(65) Prior Publication Data

US 2023/0307274 A1 Sep. 28, 2023

(30) Foreign Application Priority Data

Mar. 24, 2022 (JP) ................................. 2022-048251

(51) Int. Cl.
*H01L 21/67* (2006.01)
*H01L 21/66* (2006.01)

(52) U.S. Cl.
CPC .. *H01L 21/67288* (2013.01); *H01L 21/67115* (2013.01); *H01L 21/67248* (2013.01); *H01L 22/12* (2013.01)

(58) Field of Classification Search
CPC ......... H01L 21/67288; H01L 21/67115; H01L 21/67248; H01L 22/12; H01L 22/10; H01L 21/67253
See application file for complete search history.

(56) References Cited

U.S. PATENT DOCUMENTS

2006/0249502 A1 11/2006 Yamada et al.
2007/0076942 A1* 4/2007 Yatsugake .......... G01N 21/9501
382/141
(Continued)

FOREIGN PATENT DOCUMENTS

CN 1847786 A 10/2006
CN 102117037 A 7/2011
(Continued)

OTHER PUBLICATIONS

Notice of Decision to Grant dated Oct. 2, 2024 in corresponding Korean Patent Application No. 10-2023-0027612.
(Continued)

*Primary Examiner* — Tung S Lau
(74) *Attorney, Agent, or Firm* — OSTROLENK FABER LLP

(57) ABSTRACT

An abnormality detection device for detecting a treatment abnormality in a semiconductor wafer to be heat-treated in a heat treatment apparatus is provided. The abnormality detection device includes a lower radiation thermometer for measuring a temperature of the semiconductor wafer being heat-treated, a treatment information acquisition part (sensors) for acquiring a plurality of pieces of treatment information having a correlation with the temperature measured by the lower radiation thermometer, and a detection part for dividing heat treatment of the semiconductor wafer into a plurality of phases (heat treatment phases F1 to F7) to detect a treatment abnormality in the semiconductor wafer, based on a plurality of learning models created for the respective phases (heat treatment phases F1 to F7), based on the temperature and the treatment information.

3 Claims, 10 Drawing Sheets

(56) References Cited

U.S. PATENT DOCUMENTS

| | | | |
|---|---|---|---|
| 2011/0164889 A1 | 7/2011 | Deng | |
| 2017/0110380 A1 | 4/2017 | Nakakuki et al. | |
| 2017/0194177 A1 | 7/2017 | Cibere | |
| 2018/0138096 A1 | 5/2018 | Koyama et al. | |
| 2018/0337103 A1 | 11/2018 | Omori et al. | |
| 2019/0006208 A1 | 1/2019 | Maki et al. | |
| 2019/0267261 A1 | 8/2019 | Akiyoshi et al. | |
| 2020/0098653 A1 | 3/2020 | Sasaki et al. | |
| 2021/0116896 A1 | 4/2021 | Arabshahi et al. | |
| 2021/0304032 A1 | 9/2021 | Wakita et al. | |
| 2023/0343616 A1* | 10/2023 | Ono | G01J 5/0007 |
| 2024/0142223 A1* | 5/2024 | Paul | G01B 11/0625 |

FOREIGN PATENT DOCUMENTS

| | | | |
|---|---|---|---|
| CN | 109148330 A | 1/2019 | |
| CN | 110211895 A | 9/2019 | |
| CN | 113448307 A | 9/2021 | |
| EP | 1712877 B1 | 11/1999 | |
| JP | 2017-076273 A | 4/2017 | |
| JP | 2018-077764 A | 5/2018 | |
| JP | 2018-536284 A | 12/2018 | |
| JP | 2020-053506 A | 4/2020 | |
| KR | 2001-0071235 A | 7/2001 | |
| KR | 10-0791199 B1 | 1/2008 | |
| KR | 10-2020-0139019 A | 12/2020 | |
| KR | 10-2021-0038527 A | 4/2021 | |
| KR | 10-2022-0012389 A | 2/2022 | |
| TW | 201901809 A1 | 1/2019 | |
| WO | WO 99/59196 A1 | 11/1999 | |
| WO | WO 2017/116687 A1 | 7/2017 | |

OTHER PUBLICATIONS

Decision of Refusal For The First Examination dated Apr. 9, 2024 in corresponding Taiwanese Patent Application No. 112100800 and English translation made from the Japanese translation of the original communication.

Office Action and Search Report dated Aug. 24, 2023 in corresponding Taiwanese Patent Application No. 112100800 and English translation made from the Japanese translation of the original communication.

First Written Notice of Opinion for Examination with Search Report dated Sep. 27, 2025 in corresponding Chinese Patent Application No. 202310092572.6 with English language translation.

Notice of Reasons for Refusal dated Nov. 4, 2025 in corresponding Japanese Patent Application No. 2022-048251 with English language translation.

Notice of Decision to Grant dated Jan. 6, 2026 in corresponding Japanese Patent Application No. 2022-048251.

* cited by examiner

F I G. 4
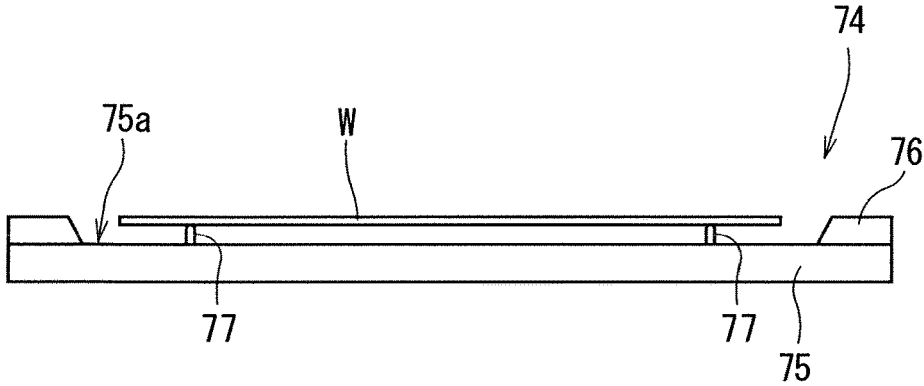
F I G. 5
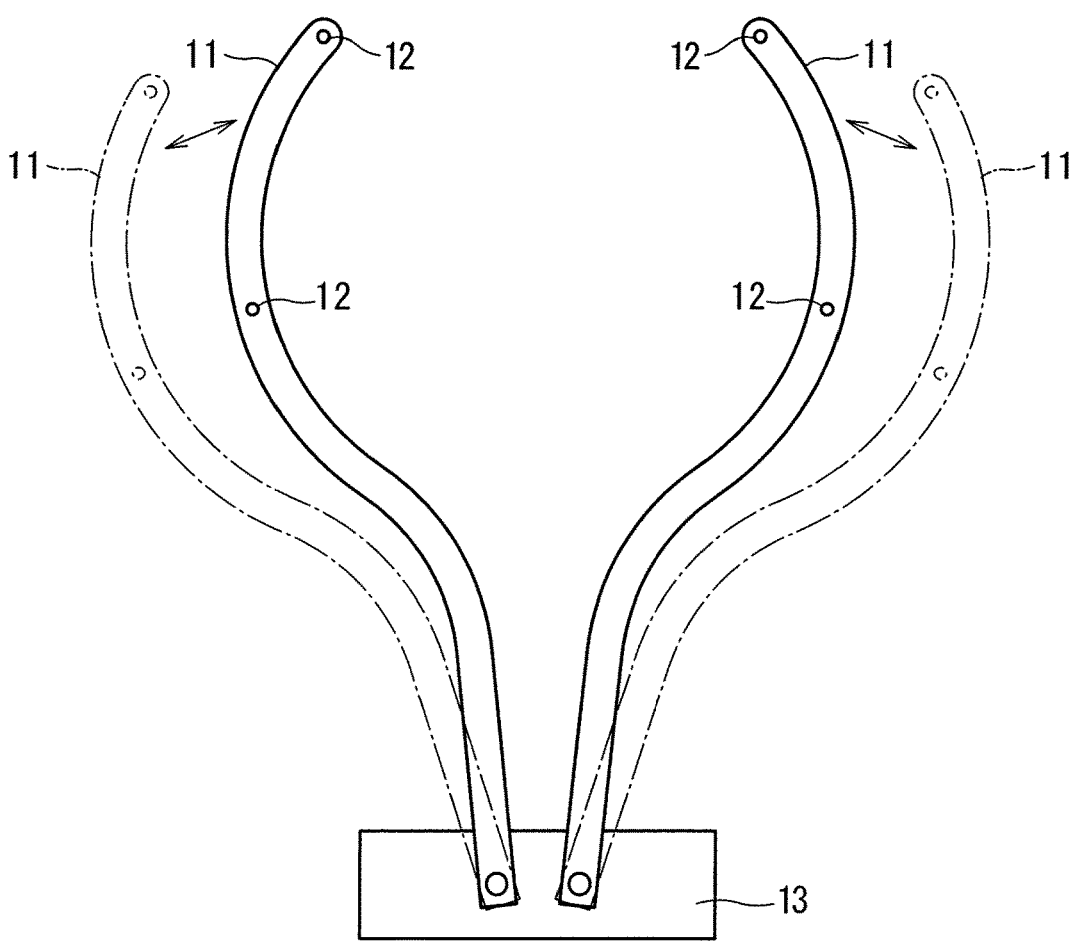

F I G. 6
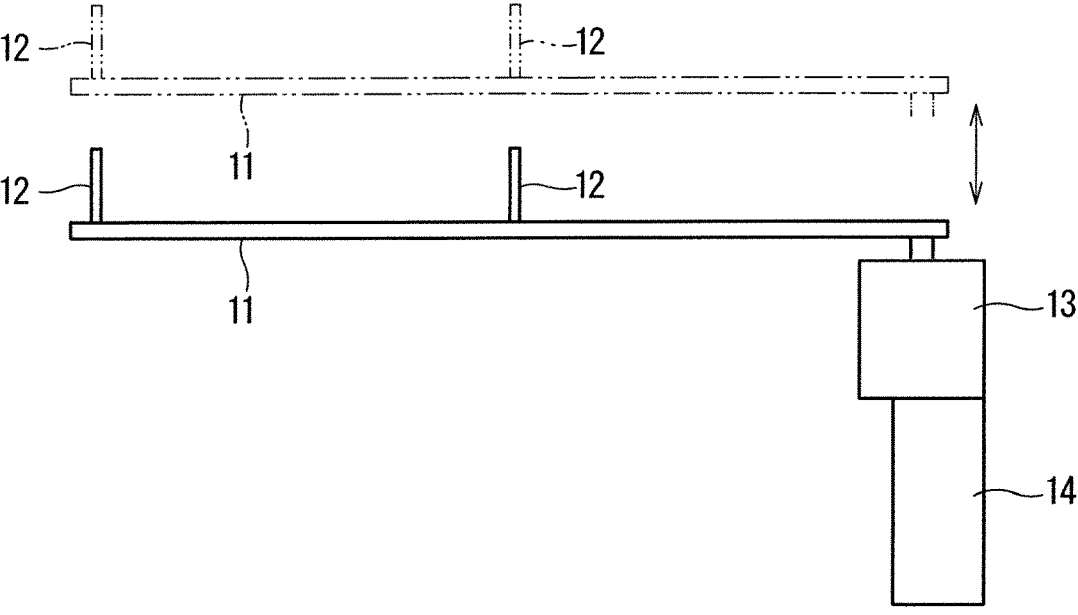
F I G. 7
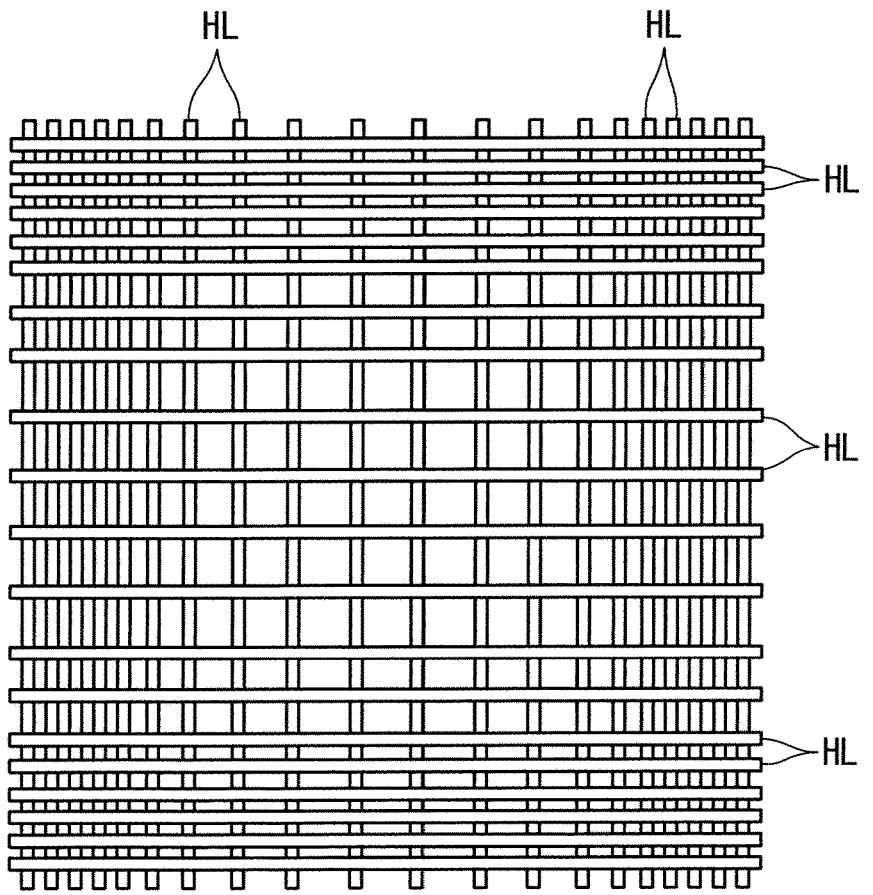

F I G. 8
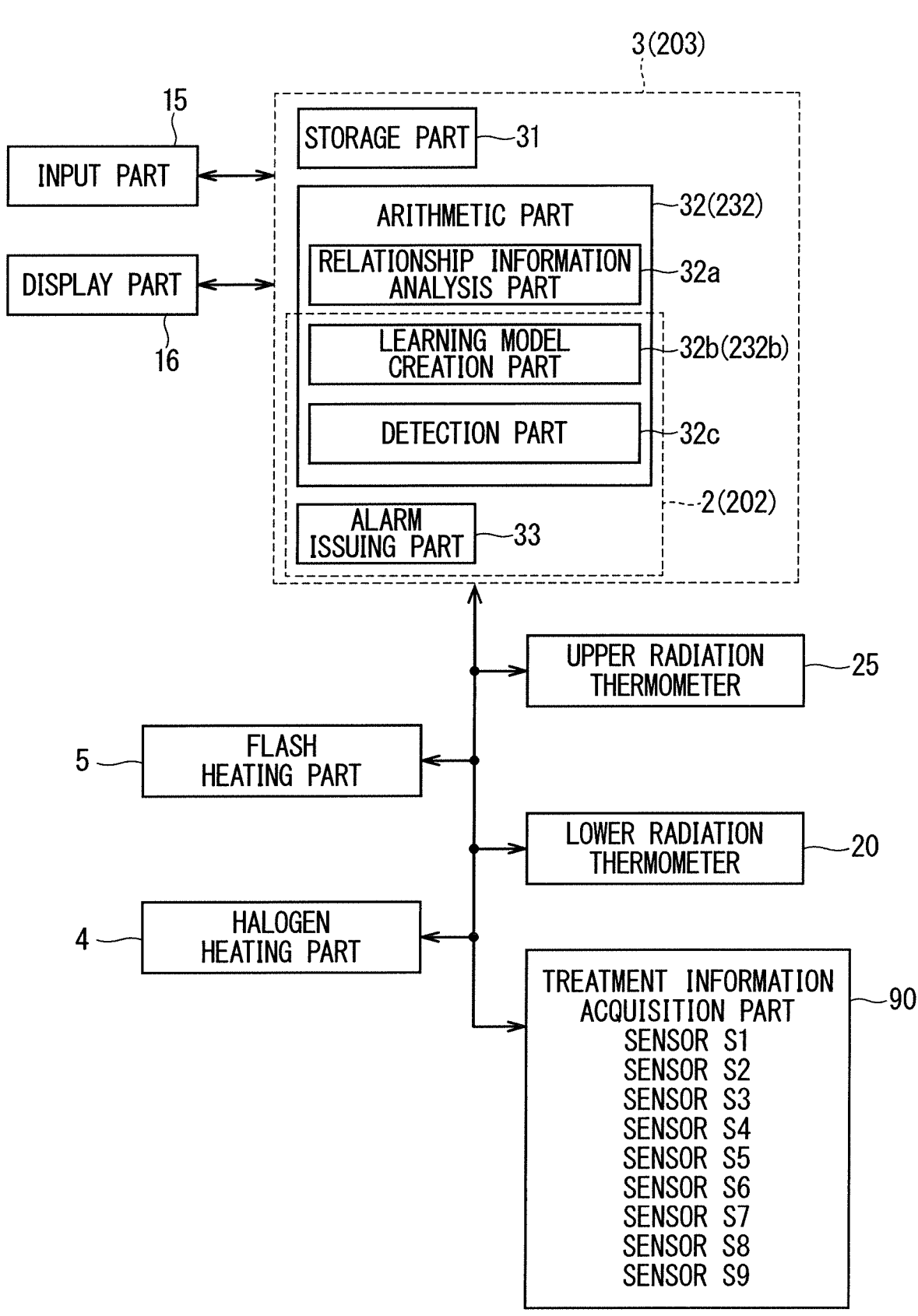

F I G. 10
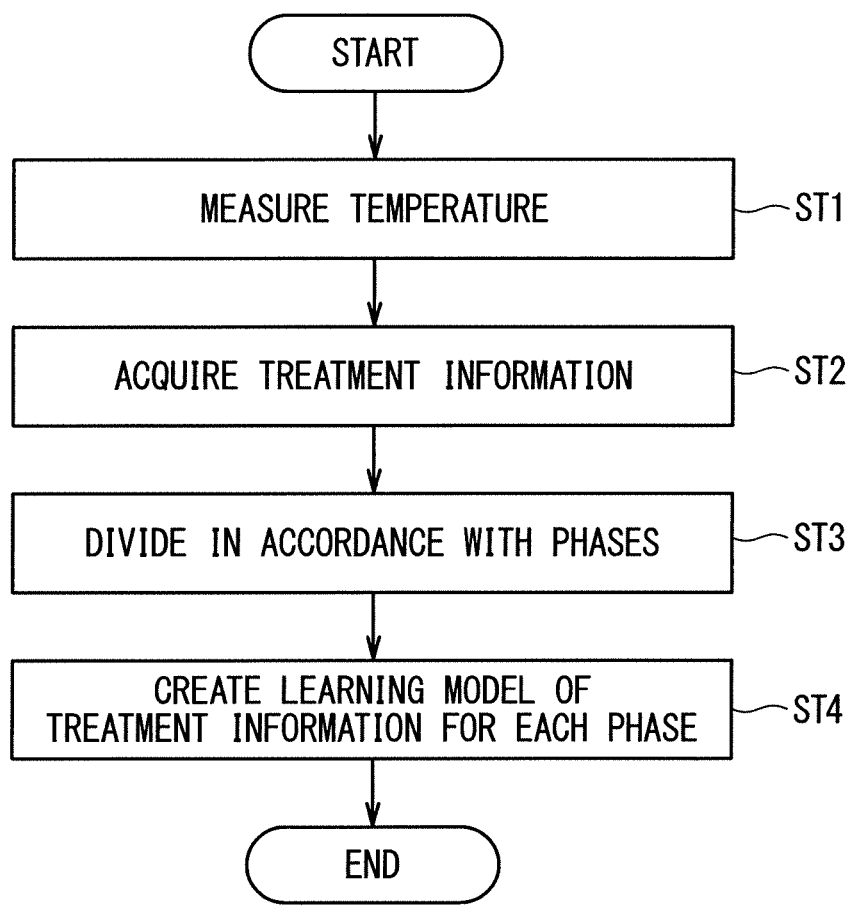

F I G. 1 1

```
                    ┌──────────┐
                    │  START   │
                    └──────────┘
                          │
                          ▼
        ┌─────────────────────────────────────┐
        │       MEASURE  TEMPERATURE          │──── ST11
        └─────────────────────────────────────┘
                          │
                          ▼
        ┌─────────────────────────────────────┐
        │   ACQUIRE  TREATMENT  INFORMATION   │──── ST12
        └─────────────────────────────────────┘
                          │
                          ▼
        ┌─────────────────────────────────────┐
        │      DIVIDE  IN  ACCORDANCE  WITH    │──── ST13
        │       HEAT  TREATMENT  PHASES        │
        └─────────────────────────────────────┘
                          │
                          ▼
        ┌─────────────────────────────────────┐
        │     CALCULATE  PREDICTED  VALUE  OF  │──── ST14
        │          LEARNING  MODEL            │
        └─────────────────────────────────────┘
                          │
                          ▼
        ┌─────────────────────────────────────┐
        │  COMPARE  ACTUAL  MEASURED  VALUE  WITH  │──── ST15
        │          PREDICTED  VALUE           │
        └─────────────────────────────────────┘
                          │
                          ▼
```

ST16

DIFFERENCE BETWEEN
PREDICTED AND ACTUAL
MEASURED VALUES $\geq$ THRESHOLD VALUE?

YES

NO

NO TREATMENT ABNORMALITY OCCURS —— ST17

RETURN

TREATMENT ABNORMALITY OCCURS —— ST18

ISSUE ALARM —— ST19

END

ABNORMALITY DETECTION DEVICE

BACKGROUND OF THE INVENTION

Field of the Invention

The present invention relates to an abnormality detection device for detecting a treatment abnormality in a thin plate-like precision electronic substrate (hereinafter referred to simply as a "substrate") such as a semiconductor wafer to be heat-treated in a heat treatment apparatus.

Description of the Background Art

National Publication of Translation No. 2018-536284 discloses an abnormality detection device for detecting a treatment abnormality in a substrate to be heat-treated. The device which measures the temperature of the upper and/or lower surface of a semiconductor wafer during the cooling period of the semiconductor wafer to thereby detect breakage in the semiconductor wafer is disclosed in National Publication of Translation No. 2018-536284. This device uses a difference between an estimated cooling model parameter value and a value obtained from temperature measurement data about the semiconductor wafer to achieve the detection of semiconductor wafer breakage.

The detection of treatment abnormalities with small changes has been difficult for a device which detects abnormalities by determining whether a difference obtained by comparing a model parameter value and an actual measured value is within a threshold range or not, such as the device disclosed in National Publication of Translation No. 2018-536284. As an example, it has been difficult to detect a decrease in output from one lamp in a heat source for heating a substrate.

On the other hand, attempts have been made to develop a device which detects abnormalities by comparing a reference value and an actual measured value for a lamp output. However, it is difficult even for such a device to differentiate between noise and a change of some degrees in substrate temperature or a change of several percent in lamp output.

SUMMARY

The present invention is intended for an abnormality detection device for detecting a treatment abnormality in a substrate to be heat-treated in a heat treatment apparatus.

According to one aspect of the present invention, the abnormality detection device comprises: a thermometer for measuring a temperature of the substrate being heat-treated; a treatment information acquisition part for acquiring a plurality of pieces of treatment information having a correlation with the temperature measured by the thermometer; and a detection part for dividing heat treatment of the substrate into a plurality of phases to detect a treatment abnormality in the substrate, based on a plurality of learning models created for the respective phases, based on the temperature and the treatment information.

The abnormality detection device is capable of detecting a small treatment abnormality and of detecting a sign of failure of the entire heat treatment apparatus by detecting the small treatment abnormality because the treatment abnormality in the substrate is detected based on the plurality of learning models created for the respective phases.

It is therefore an object of the present invention to provide an abnormality detection device capable of detecting a small treatment abnormality and of detecting a sign of failure of the entire heat treatment apparatus by detecting the small treatment abnormality.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a sectional view of the susceptor;

FIG. 5 is a plan view of a transfer mechanism;

FIG. 6 is a side view of the transfer mechanism;

FIG. 7 is a plan view showing an arrangement of halogen lamps in a halogen heating part;

FIG. 8 is a functional block diagram schematically showing an electrical configuration of the heat treatment apparatus including an abnormality detection device;

FIG. 10 is a flow diagram showing a procedure for the creation of the learning models by means of the abnormality detection device;

FIG. 11 is a flow diagram showing a procedure for the detection of a treatment abnormality by means of the abnormality detection device.

DESCRIPTION OF THE PREFERRED EMBODIMENTS

Figure 1:
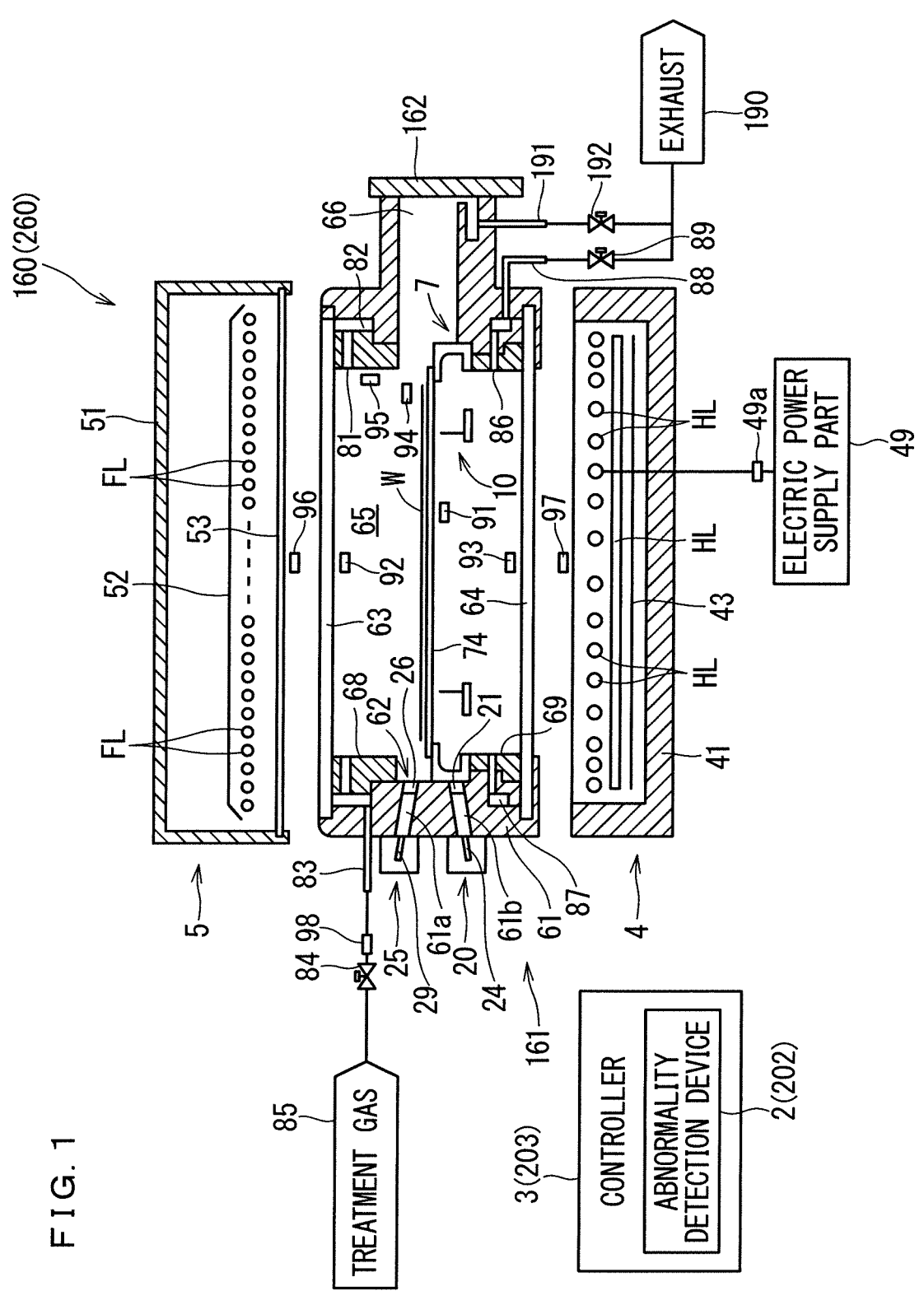
FIG. 1 is a sectional view schematically showing a configuration of a heat treatment apparatus according to a first preferred embodiment.

Preferred embodiments will now be described with reference to the accompanying drawings. In the following preferred embodiments, detailed features and the like are shown for the purpose of illustrating the technique, but are illustrative. Not all of the detailed features are necessarily essential to make the preferred embodiment feasible.

In the drawings, figures show schematic representations, and components are not shown or shown in simplified form, as appropriate, for convenience of illustration. The sizes and positions of components shown in different figures are not necessarily in a correct correlation, but may be changed, as appropriate. In figures that are plan views or the like rather than sectional views, components are in some cases hatched or shaded for the purpose of facilitating the understanding of the details of the preferred embodiments.

In the following description, similar components are designated by and shown using the same reference numerals and characters, and shall have similar designations and functions. Thus, these components will not be described in detail in some cases for the purpose of avoiding repetition in description.

In the following description, the expression "comprising", "including", or "having" a component is not an exclusive expression that excludes the presence of other components, unless otherwise specified.

In the case where ordinal numerals such as "first", "second", or the like are used in the following description, these terms shall be used for the sake of convenience and for the purpose of facilitating the understanding of the details of the preferred embodiments, and shall not be limited to the order caused by the ordinal numerals.

In the following description, expressions indicating relative or absolute positional relationships, such as "in one direction", "along one direction", "parallel", "orthogonal", "center", "concentric", or "coaxial", shall include cases in which the positional relationships are strictly indicated and cases in which the angle or distance is displaced to the extent that tolerances or similar functions are obtained, unless otherwise specified.

In the following description, expressions indicating equal states, such as "identical", "equal", "uniform", or "homogeneous", shall include cases in which the expressions indicate strictly equal states and cases in which differences occur to the extent that tolerances or similar functions are obtained, unless otherwise specified.

Terms that mean specific positions or directions such as "upper", "lower", "left", "right", "side", "bottom", "front", or "back" in the following description, if any, shall be used for the sake of convenience and for the purpose of facilitating the understanding of the details of the preferred embodiments, and shall not be related to positions or directions used during actual implementation.

The expression "upper face of" or "lower face of" a first component used in the following description is to be interpreted as including a situation in which a second component is formed on the upper or lower face of the first component in addition to meaning the upper or lower face itself of the first component. That is, the expression "a first component provided on an upper face of a second component" used as an example shall not preclude the presence of a third component interposed between the first and second components.

First Preferred Embodiment

An abnormality detection device for a heat treatment apparatus according to a first preferred embodiment will be described.

<Configuration of Heat Treatment Apparatus 160>

FIG. 1 is a sectional view schematically showing a configuration of a heat treatment apparatus 160 according to the first preferred embodiment.

As an example is shown in FIG. 1, the heat treatment apparatus 160 of the present preferred embodiment is an apparatus for irradiating a disk-shaped semiconductor wafer W serving as a substrate with light to heat the semiconductor wafer W.

The size of the semiconductor wafer W to be treated is not particularly limited. For example, the semiconductor wafer W to be treated has a diameter of 300 mm or 450 mm (in the present preferred embodiment, 300 mm).

The heat treatment apparatus 160 includes a chamber 161 for receiving a semiconductor wafer W therein, a flash heating part 5 including a plurality of built-in flash lamps FL as a main heating part, and a halogen heating part 4 including a plurality of built-in halogen lamps HL as a preheating part. The flash heating part 5 is provided over the chamber 161, and the halogen heating part 4 is provided under the chamber 161. The heat treatment apparatus 160 further includes a controller 3 for controlling operating mechanisms provided in the halogen heating part 4, the flash heating part 5, and the chamber 161 to cause the operating mechanisms to heat-treat a semiconductor wafer W. In the present preferred embodiment, an abnormality detection device 2 for detecting an abnormality in the heat treatment apparatus 160 is included in the controller 3. In the present preferred embodiment, the halogen heating part 4 includes the plurality of halogen lamps HL. However, the halogen heating part 4 may include arc lamps or LEDs (Light-Emitting Diodes) in place of the halogen lamps HL. With the aforementioned configuration, the semiconductor wafer W is heated while being received in the chamber 161.

The flash lamps FL irradiate a semiconductor wafer W with flashes of light to thereby heat the semiconductor wafer W. The halogen lamps HL continuously heat the semiconductor wafer W.

The heat treatment apparatus 160 further includes a holder 7 provided inside the chamber 161 and for holding a semiconductor wafer W in a horizontal attitude, and a transfer mechanism 10 provided inside the chamber 161 and for transferring a semiconductor wafer W between the holder 7 and the outside of the heat treatment apparatus 160.

The chamber 161 is closed by an upper chamber window 63 made of quartz and mounted on an upper surface of a chamber housing (chamber side portion 61).

The upper chamber window 63 forming the ceiling of the chamber 161 is a disk-shaped member made of quartz, and serves as a quartz window that transmits light emitted from the flash heating part 5 therethrough into the chamber 161.

A lower chamber window 64 forming the floor of the chamber 161 is also a disk-shaped member made of quartz, and serves as a quartz window that transmits light emitted from the halogen heating part 4 therethrough into the chamber 161.

An upper reflective ring 68 is mounted to an upper portion of the inner wall surface of the chamber side portion 61, and a lower reflective ring 69 is mounted to a lower portion thereof. Both the upper reflective ring 68 and the lower reflective ring 69 are in the form of an annular ring.

The upper reflective ring 68 is mounted by being inserted downwardly from the top of the chamber side portion 61. The lower reflective ring 69, on the other hand, is mounted by being inserted upwardly from the bottom of the chamber side portion 61 and fastened with screws not shown. In other words, the upper reflective ring 68 and the lower reflective ring 69 are removably mounted to the chamber side portion 61.

An interior space of the chamber 161, i.e. a space surrounded by the upper chamber window 63, the chamber housing (chamber side portion 61), and the upper reflective ring 68, is defined as a heat treatment space 65.

A recessed portion 62 is defined in the inner wall surface of the chamber 161 by mounting the upper reflective ring 68 and the lower reflective ring 69 to the chamber side portion 61. Specifically, the recessed portion 62 is defined which is surrounded by a middle portion of the inner wall surface of the chamber side portion 61 where the upper reflective ring 68 and the lower reflective ring 69 are not mounted, a lower end surface of the upper reflective ring 68, and an upper end surface of the lower reflective ring 69.

The recessed portion 62 is provided in the form of a horizontal annular ring in the inner wall surface of the chamber 161, and surrounds the holder 7 which holds a semiconductor wafer W. The chamber side portion 61, the upper reflective ring 68, and the lower reflective ring 69 are made of a metal material (e.g., stainless steel) with high strength and high heat resistance.

The chamber housing (chamber side portion 61) is provided with a transport opening (throat) 66 for the transport of a semiconductor wafer W therethrough into and out of the chamber 161. The transport opening 66 is openable and closable by a gate valve 162. The transport opening 66 is connected in communication with an outer peripheral surface of the recessed portion 62.

Thus, when the transport opening 66 is opened by the gate valve 162, a semiconductor wafer W is allowed to be transported through the transport opening 66 and the recessed portion 62 into and out of the heat treatment space 65. When the transport opening 66 is closed by the gate valve 162, the heat treatment space 65 in the chamber 161 is an enclosed space.

An upper radiation thermometer 25 and a lower radiation thermometer 20 are attached to locations where a through hole 61a and a through hole 61b, respectively, in the outer wall surface of the chamber side portion 61 are provided. The through hole 61a is a cylindrical hole for directing infrared light emitted from an upper surface of a semiconductor wafer W held by a susceptor 74 to be described later therethrough to the upper radiation thermometer 25. The through hole 61b is a cylindrical hole for directing infrared light emitted from a lower surface of the semiconductor wafer W held by the susceptor 74 to be described later therethrough to the lower radiation thermometer 20. The through holes 61a and 61b are inclined with respect to a horizontal direction so that the longitudinal axes (axes extending in respective directions in which the through holes 61a and 61b extend through the chamber side portion 61) of the respective through holes 61a and 61b intersect main surfaces of the semiconductor wafer W held by the susceptor 74. A transparent window 26 made of calcium fluoride material transparent to infrared light in a wavelength range measurable with the upper radiation thermometer 25 is mounted to an end portion of the through hole 61a which faces the heat treatment space 65. A transparent window 21 made of barium fluoride material transparent to infrared light in a wavelength range measurable with the lower radiation thermometer 20 is mounted to an end portion of the through hole 61b which faces the heat treatment space 65.

The upper radiation thermometer 25 is provided obliquely above the semiconductor wafer W held by the susceptor 74, and receives infrared light emitted from the upper surface of the semiconductor wafer W to measure the temperature of the upper surface. An infrared sensor 29 provided in the upper radiation thermometer 25 includes an optical element made of InSb (indium antimonide) so as to be able to respond to rapid changes in temperature of the upper surface of the semiconductor wafer W at the moment of flash irradiation.

On the other hand, the lower radiation thermometer 20 is provided obliquely below the semiconductor wafer W held by the susceptor 74, and receives infrared light emitted from the lower surface of the semiconductor wafer W to measure the temperature of the lower surface. The lower radiation thermometer 20 includes an infrared sensor 24 to measure the temperature of the lower surface of the semiconductor wafer W. Temperature sensors 91, 92, 93, 94, and 95 are installed in the chamber 161. The temperature sensor 91 measures the temperature of the susceptor 74. The temperature sensor 92 measures the temperature of the upper chamber window 63. The temperature sensor 93 measures the temperature of the lower chamber window 64. The temperature sensor 94 measures the temperature of an atmosphere in the chamber 161. The temperature sensor 95 measures the temperature of wall surfaces of the chamber 161.

At least one gas supply opening 81 for supplying a treatment gas therethrough into the heat treatment space 65 is provided in an upper portion of the inner wall of the chamber 161. The gas supply opening 81 is provided above the recessed portion 62, and may be provided in the upper reflective ring 68. The gas supply opening 81 is connected in communication with a gas supply pipe 83 through a buffer space 82 provided in the form of an annular ring inside the side wall of the chamber 161.

The gas supply pipe 83 is connected to a treatment gas supply source 85. A valve 84 is interposed in the gas supply pipe 83. When the valve 84 is opened, the treatment gas is fed from the treatment gas supply source 85 to the buffer space 82. A flowmeter 98 is connected downstream of the valve 84. The flowmeter 98 measures the flow rate of the treatment gas passing through the valve 84.

The treatment gas flowing in the buffer space 82 flows in a spreading manner within the buffer space 82 which is lower in fluid resistance than the gas supply opening 81, and is supplied through the gas supply opening 81 into the heat treatment space 65. Examples of the treatment gas usable herein include inert gases such as nitrogen ($N_2$) and reactive gases such as hydrogen ($H_2$) and ammonia ($NH_3$) (although nitrogen is used in the present preferred embodiment).

At least one gas exhaust opening 86 for exhausting a gas from the heat treatment space 65 is provided in a lower portion of the inner wall of the chamber 161. The gas exhaust opening 86 is provided below the recessed portion 62, and may be provided in the lower reflective ring 69. The gas exhaust opening 86 is connected in communication with a gas exhaust pipe 88 through a buffer space 87 provided in the form of an annular ring inside the side wall of the chamber 161. The gas exhaust pipe 88 is connected to an exhaust mechanism 190. A valve 89 is interposed in the gas exhaust pipe 88. When the valve 89 is opened, the gas in the heat treatment space 65 is exhausted through the gas exhaust opening 86 and the buffer space 87 to the gas exhaust pipe 88.

The at least one gas supply opening 81 and the at least one gas exhaust opening 86 may include a plurality of gas supply openings 81 and a plurality of gas exhaust openings 86, respectively, arranged in a circumferential direction of the chamber 161, and may be in the form of slits. The treatment gas supply source 85 and the exhaust mechanism 190 may be mechanisms provided in the heat treatment apparatus 160 or be utility systems in a factory in which the heat treatment apparatus 160 is installed.

A gas exhaust pipe 191 for exhausting the gas from the heat treatment space 65 is also connected to a distal end of the transport opening 66. The gas exhaust pipe 191 is connected through a valve 192 to the exhaust mechanism 190. By opening the valve 192, the gas in the chamber 161 is exhausted through the transport opening 66.

Figure 2:
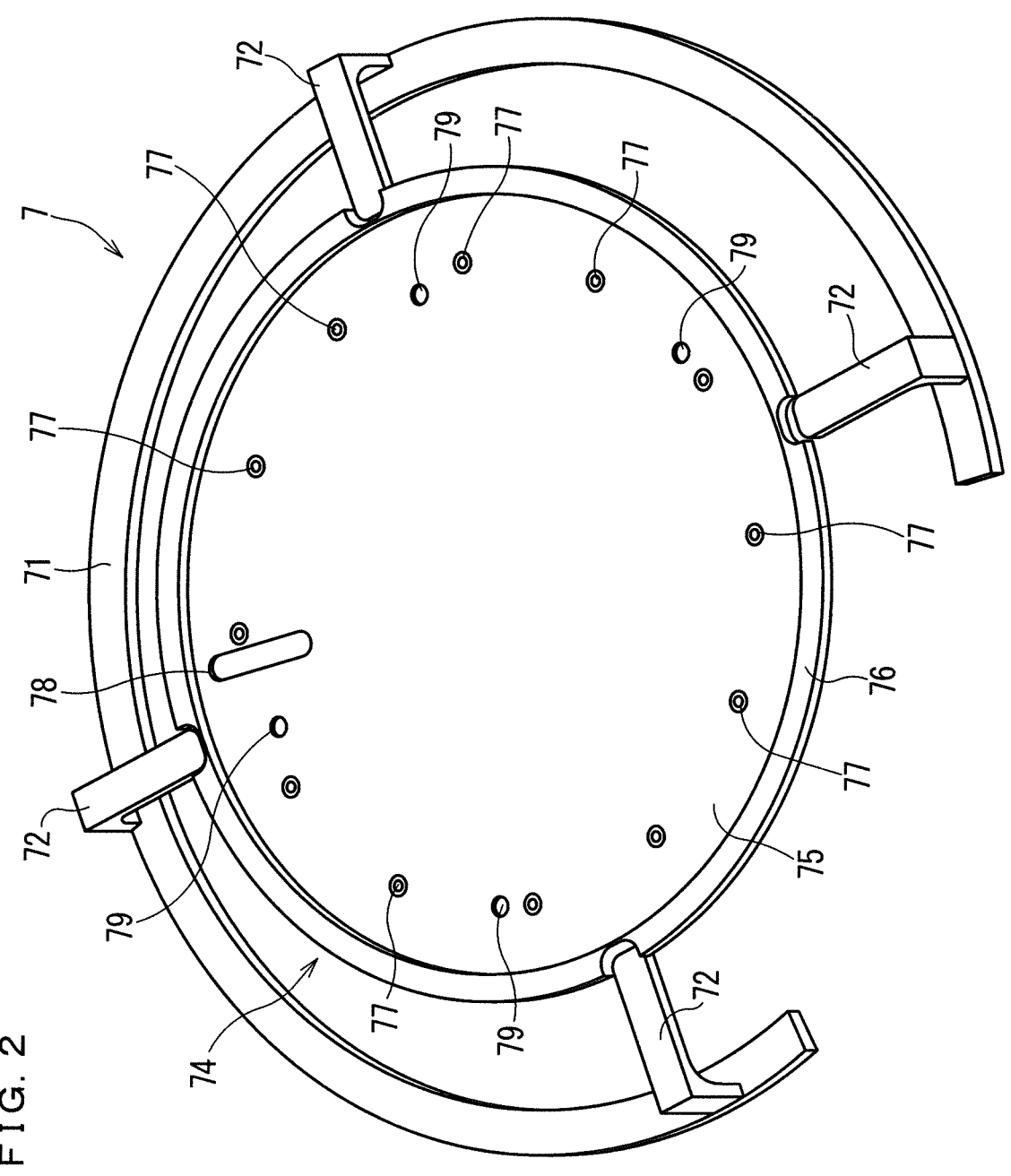
FIG. 2 is a perspective view showing the entire external appearance of a holder.

FIG. 2 is a perspective view showing the entire external appearance of the holder 7. The holder 7 includes a base ring 71, coupling portions 72, and the susceptor 74. The base ring 71, the coupling portions 72, and the susceptor 74 are all made of quartz. In other words, the whole of the holder 7 is made of quartz.

The base ring 71 is a quartz member having an arcuate shape obtained by removing a portion from an annular shape. This removed portion is provided to prevent interference between transfer arms 11 of the transfer mechanism 10 to be described later and the base ring 71. The base ring 71 is supported by the wall surface of the chamber 161 by being placed on the bottom surface of the recessed portion 62 (with reference to FIG. 1). The multiple coupling portions 72 (in the present preferred embodiment, four coupling portions 72) are mounted upright on the upper surface of the base ring 71 and arranged in a circumferential direction of the annular shape thereof. The coupling portions 72 are quartz members, and are rigidly secured to the base ring 71 by welding.

Figure 3:
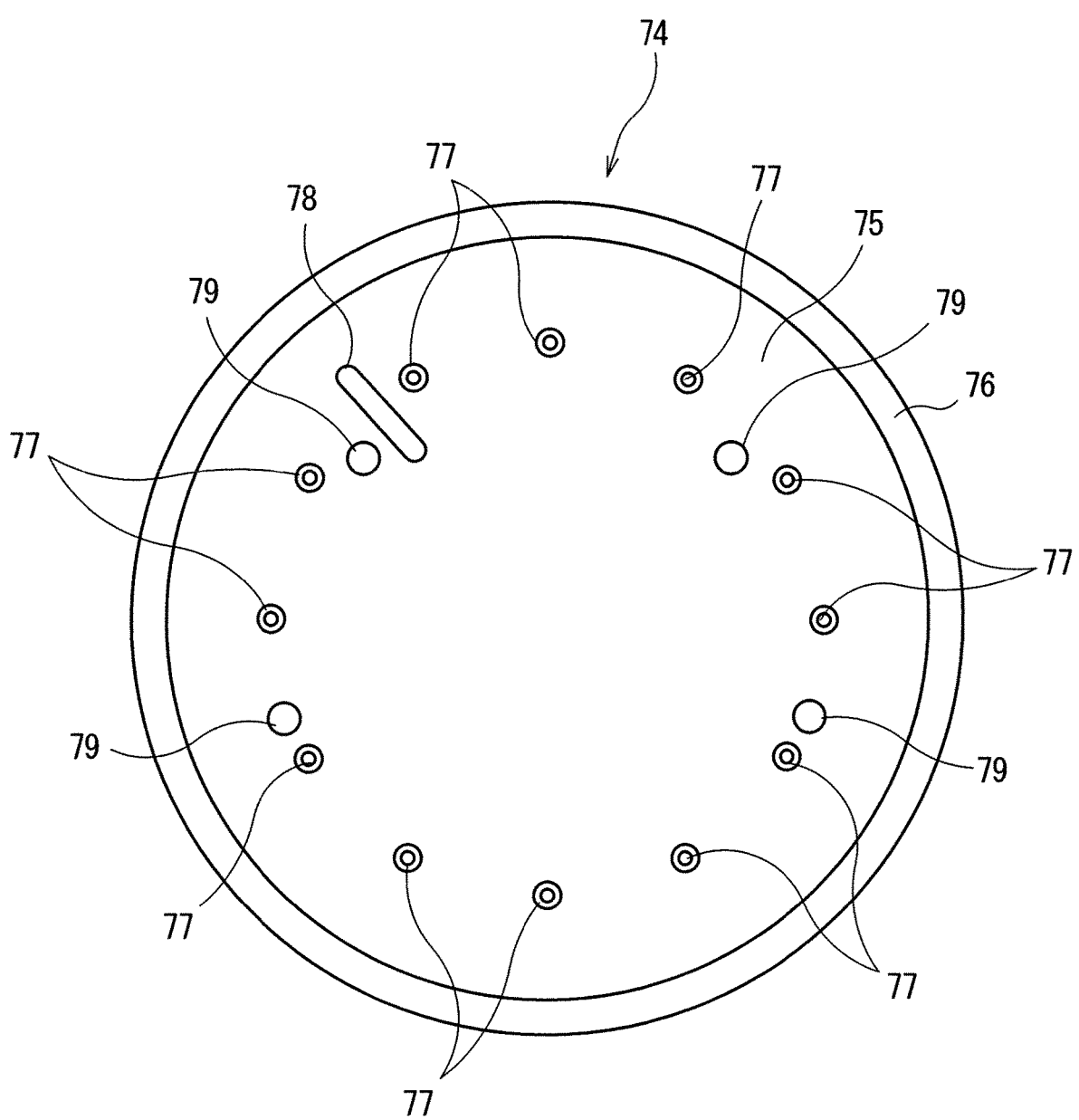
FIG. 3 is a plan view of a susceptor.

The susceptor 74 is supported from below by the four coupling portions 72 provided on the base ring 71. FIG. 3 is a plan view of the susceptor 74. FIG. 4 is a sectional view of the susceptor 74.

The susceptor 74 includes a holding plate 75, a guide ring 76, and a plurality of support pins 77. The holding plate 75 is a generally circular planar member made of quartz. The diameter of the holding plate 75 is greater than that of a semiconductor wafer W. In other words, the holding plate 75 has a size, as seen in plan view, greater than that of the semiconductor wafer W.

The guide ring 76 is provided on a peripheral portion of the upper surface of the holding plate 75. The guide ring 76 is an annular member having an inner diameter greater than the diameter of the semiconductor wafer W. For example, when the diameter of the semiconductor wafer W is 300 mm, the inner diameter of the guide ring 76 is 320 mm.

The inner periphery of the guide ring 76 is in the form of a tapered surface which becomes wider in an upward direction from the holding plate 75. The guide ring 76 is made of quartz similar to that of the holding plate 75.

The guide ring 76 may be welded to the upper surface of the holding plate 75 or fixed to the holding plate 75 with separately machined pins and the like. Alternatively, the holding plate 75 and the guide ring 76 may be machined as an integral member.

A region of the upper surface of the holding plate 75 which is inside the guide ring 76 serves as a planar holding surface 75a for holding the semiconductor wafer W. The support pins 77 are provided on the holding surface 75a of the holding plate 75. In the present preferred embodiment, a total of 12 support pins 77 spaced at intervals of 30 degrees along the circumference of a circle concentric with the outer circumference of the holding surface 75a (the inner circumference of the guide ring 76) are provided upright in an annular form.

The diameter of the circle on which the 12 support pins 77 are disposed (the distance between opposed ones of the support pins 77) is smaller than the diameter of the semiconductor wafer W, and is 210 to 280 mm when the diameter of the semiconductor wafer W is 300 mm. At least three support pins 77 are provided. Each of the support pins 77 is made of quartz.

The support pins 77 may be provided by welding on the upper surface of the holding plate 75 or machined integrally with the holding plate 75.

Referring again to FIG. 2, the four coupling portions 72 provided upright on the base ring 71 and the peripheral portion of the holding plate 75 of the susceptor 74 are rigidly secured to each other by welding. In other words, the susceptor 74 and the base ring 71 are fixedly coupled to each other with the coupling portions 72. The base ring 71 of such a holder 7 is supported by the wall surface of the chamber 161, whereby the holder 7 is mounted to the chamber 161. With the holder 7 mounted to the chamber 161, the holding plate 75 of the susceptor 74 assumes a horizontal attitude (an attitude such that the normal to the holding plate 75 coincides with a vertical direction). In other words, the holding surface 75a of the holding plate 75 becomes a horizontal surface.

A semiconductor wafer W transported into the chamber 161 is placed and held in a horizontal attitude on the upper side of the susceptor 74 of the holder 7 mounted to the chamber 161. At this time, the semiconductor wafer W is supported by the 12 support pins 77 provided upright on the holding plate 75, and is supported by the susceptor 74 from below. More strictly speaking, the 12 support pins 77 have respective upper end portions coming in contact with the lower surface (back surface) of the semiconductor wafer W to support the semiconductor wafer W.

The semiconductor wafer W is supported in a horizontal attitude by the 12 support pins 77 because the 12 support pins 77 have a uniform height (distance from the upper ends of the support pins 77 to the holding surface 75a of the holding plate 75).

The semiconductor wafer W supported by the support pins 77 is spaced a predetermined distance apart from the holding surface 75a of the holding plate 75. The thickness of the guide ring 76 is greater than the height of the support pins 77. Thus, the guide ring 76 prevents the horizontal misregistration of the semiconductor wafer W supported by the support pins 77.

As shown in FIGS. 2 and 3, an opening 78 is provided in the holding plate 75 of the susceptor 74 so as to extend vertically through the holding plate 75 of the susceptor 74. The opening 78 is provided for the lower radiation thermometer 20 to receive radiation (infrared light) emitted from the lower surface (back surface) of the semiconductor wafer W. Specifically, the lower radiation thermometer 20 receives the radiation emitted from the lower surface (back surface) of the semiconductor wafer W through the opening 78 and through the transparent window 21 (mounted to the through hole 61b) of the chamber housing (chamber side portion 61) to measure the temperature of the semiconductor wafer W.

Further, the holding plate 75 of the susceptor 74 further includes four through holes 79 bored therein and designed so that lift pins 12 of the transfer mechanism 10 to be described later pass through the through holes 79, respectively, to transfer a semiconductor wafer W.

FIG. 5 is a plan view of the transfer mechanism 10. FIG. 6 is a side view of the transfer mechanism 10. The transfer mechanism 10 includes the two transfer arms 11. The transfer arms 11 are of an arcuate configuration extending substantially along the annular recessed portion 62.

Each of the transfer arms 11 includes the two lift pins 12 mounted upright thereon. The transfer arms 11 and the lift pins 12 are made of quartz. The transfer arms 11 are pivotable by a horizontal movement mechanism 13. The horizontal movement mechanism 13 moves the pair of transfer arms 11 horizontally between a transfer operation position (a position indicated by solid lines in FIG. 5) in which a semiconductor wafer W is transferred to and from the holder 7 and a retracted position (a position indicated by dash-double-dot lines in FIG. 5) in which the transfer arms 11 do not overlap the semiconductor wafer W held by the holder 7 as seen in plan view.

The horizontal movement mechanism 13 may be of the type which causes individual motors to pivot the transfer arms 11 respectively or of the type which uses a linkage mechanism to cause a single motor to pivot the pair of transfer arms 11 in cooperative relation.

The transfer arms 11 are moved upwardly and downwardly together with the horizontal movement mechanism 13 by an elevating mechanism 14. As the elevating mechanism 14 moves up the pair of transfer arms 11 in their transfer operation position, the four lift pins 12 in total pass through the respective four through holes 79 (with reference to FIGS. 2 and 3) bored in the susceptor 74, so that the upper ends of the lift pins 12 protrude from the upper surface of the susceptor 74. On the other hand, as the elevating mechanism 14 moves down the pair of transfer arms 11 in their transfer operation position to take the lift pins 12 out of the respective through holes 79 and the horizontal movement mechanism 13 moves the pair of transfer arms 11 so as to open the transfer arms 11, the transfer arms 11 move to their retracted position.

The retracted position of the pair of transfer arms 11 is immediately over the base ring 71 of the holder 7. The retracted position of the transfer arms 11 is inside the recessed portion 62 because the base ring 71 is placed on the bottom surface of the recessed portion 62. An exhaust mechanism not shown is also provided near the location where the drivers (the horizontal movement mechanism 13 and the elevating mechanism 14) of the transfer mechanism 10 are provided, and is configured to exhaust an atmosphere around the drivers of the transfer mechanism 10 to the outside of the chamber 161.

Referring again to FIG. 1, the flash heating part 5 provided over the chamber 161 includes an enclosure 51, a light source provided inside the enclosure 51 and including the multiple (in the present preferred embodiment, 30) xenon flash lamps FL, and a reflector 52 provided inside the enclosure 51 so as to cover the light source from above.

The flash heating part 5 further includes a lamp light radiation window 53 mounted to the bottom of the enclosure 51. The lamp light radiation window 53 forming the floor of the flash heating part 5 is a plate-like quartz window made of quartz. The flash heating part 5 is provided over the chamber 161, whereby the lamp light radiation window 53 is opposed to the upper chamber window 63. The flash lamps FL direct flashes of light from over the chamber 161 through the lamp light radiation window 53 and the upper chamber window 63 toward the heat treatment space 65. A light amount sensor 96 is attached to the lamp light radiation window 53. The amount of light emitted from the flash lamps FL is detected by the light amount sensor 96.

The flash lamps FL, each of which is a rod-shaped lamp having an elongated cylindrical shape, are arranged in a plane so that the longitudinal directions of the respective flash lamps FL are in parallel with each other along a main surface (front surface) of a semiconductor wafer W held by the holder 7 (that is, in a horizontal direction). Thus, a plane defined by the arrangement of the flash lamps FL is also a horizontal plane.

Each of the flash lamps FL includes a rod-shaped glass tube (discharge tube) containing xenon gas sealed therein and having positive and negative electrodes provided on opposite ends thereof and connected to a capacitor, and a trigger electrode attached to the outer peripheral surface of the glass tube.

Because the xenon gas is electrically insulative, no current flows in the glass tube in a normal state even if electrical charge is stored in the capacitor. However, if a high voltage is applied to the trigger electrode to produce an electrical breakdown, electricity stored in the capacitor flows momentarily in the glass tube, and xenon atoms or molecules are excited at this time to cause light emission.

Such a flash lamp FL has the property of being capable of emitting extremely intense light as compared with a light source that stays lit continuously such as a halogen lamp HL because the electrostatic energy previously stored in the capacitor is converted into an ultrashort light pulse ranging from 0.1 to 100 milliseconds. Thus, the flash lamps FL are pulsed light emitting lamps which emit light instantaneously for an extremely short time period of less than one second. The light emission time of the flash lamps FL is adjustable by the coil constant of a lamp light source which supplies power to the flash lamps FL.

The reflector 52 is provided over the plurality of flash lamps FL so as to cover all of the flash lamps FL. A fundamental function of the reflector 52 is to reflect flashes of light emitted from the plurality of flash lamps FL toward the heat treatment space 65. The reflector 52 is a plate made of an aluminum alloy. An upper surface of the reflector 52 (a surface which faces the flash lamps FL) is roughened by abrasive blasting.

The halogen heating part 4 provided under the chamber 161 includes an enclosure 41 incorporating the multiple (in the present preferred embodiment, 40) halogen lamps HL. The halogen heating part 4 directs light from under the chamber 161 through the lower chamber window 64 toward the heat treatment space 65 to heat the semiconductor wafer W by means of the halogen lamps HL. A light amount sensor 97 is attached to an upper portion of the enclosure 41. The amount of light emitted from the halogen lamps HL is detected by the light amount sensor 97.

FIG. 7 is a plan view showing an arrangement of the multiple halogen lamps HL in the halogen heating part 4. The 40 halogen lamps HL are arranged in two tiers, i.e. upper and lower tiers. That is, 20 halogen lamps HL are arranged in the upper tier closer to the holder 7, and 20 halogen lamps HL are arranged in the lower tier farther from the holder 7 than the upper tier.

Each of the halogen lamps HL is a rod-shaped lamp having an elongated cylindrical shape. The 20 halogen lamps HL in each of the upper and lower tiers are arranged so that the longitudinal directions thereof are in parallel with each other along a main surface (front surface) of a semiconductor wafer W held by the holder 7 (that is, in a horizontal direction). Thus, a plane defined by the arrangement of the halogen lamps HL in each of the upper and lower tiers is also a horizontal plane.

As shown in FIG. 7, the halogen lamps HL in each of the upper and lower tiers are disposed at a higher density in a region opposed to a peripheral portion of the semiconductor wafer W held by the holder 7 than in a region opposed to a central portion thereof. In other words, the halogen lamps HL in each of the upper and lower tiers are arranged at shorter intervals in a peripheral portion of the lamp arrangement than in a central portion thereof. This allows a greater amount of light to impinge upon the peripheral portion of the semiconductor wafer W where a temperature decrease is prone to occur when the semiconductor wafer W is heated by the irradiation thereof with light from the halogen heating part 4.

As shown in FIG. 1, a voltage is applied from an electric power supply part 49 to each of the halogen lamps HL to cause the halogen lamps HL to emit light. The electric power supply part 49 individually adjusts the electric power supplied to each of the halogen lamps HL in accordance with the control of the controller 3. In other words, the electric power supply part 49 is capable of individually adjusting the light emission intensity of each of the halogen lamps HL arranged in the halogen heating part 4.

The group of halogen lamps HL in the upper tier and the group of halogen lamps HL in the lower tier are arranged to intersect each other in a lattice pattern. In other words, the 40 halogen lamps HL in total are disposed so that the longitudinal direction of the 20 halogen lamps HL arranged in the upper tier and the longitudinal direction of the 20 halogen lamps HL arranged in the lower tier are orthogonal to each other.

Each of the halogen lamps HL is a filament-type light source which passes current through a filament disposed in a glass tube to make the filament incandescent, thereby emitting light. A gas prepared by introducing a halogen element (iodine, bromine and the like) in trace amounts into an inert gas such as nitrogen, argon and the like is sealed in the glass tube. The introduction of the halogen element allows the temperature of the filament to be set at a high temperature while suppressing a break in the filament.

Thus, the halogen lamps HL have the properties of having a longer life than typical incandescent lamps and being capable of continuously emitting intense light. That is, the halogen lamps HL are continuous lighting lamps that emit light continuously for not less than one second. In addition, the halogen lamps HL, which are rod-shaped lamps, have a long life. The arrangement of the halogen lamps HL in a horizontal direction provides good efficiency of radiation toward the semiconductor wafer W provided over the halogen lamps HL. A reflector 43 is provided also inside the enclosure 41 of the halogen heating part 4 under the halogen lamps HL arranged in two tiers (FIG. 1). The reflector 43 reflects the light emitted from the halogen lamps HL toward the heat treatment space 65.

The heat treatment apparatus 160 further includes various cooling structures to prevent an excessive temperature rise in the halogen heating part 4, the flash heating part 5, and the chamber 161 because of the heat energy generated from the halogen lamps HL and the flash lamps FL during the heat treatment of a semiconductor wafer W. As an example, a water cooling tube (not shown) is provided in the walls of the chamber 161. Also, the halogen heating part 4 and the flash heating part 5 have an air cooling structure for forming a gas flow therein to exhaust heat. Air is supplied to a gap between the upper chamber window 63 and the lamp light radiation window 53 to cool down the flash heating part 5 and the upper chamber window 63.

Next, a treatment operation in the heat treatment apparatus 160 will be described. A procedure for the treatment of the semiconductor wafer W which will be described below proceeds under the control of the controller 3 over the operating mechanisms of the heat treatment apparatus 160.

Prior to the treatment of the semiconductor wafer W, the valve 84 for supply of gas is opened, and the valve 89 for exhaust of gas is opened, so that the supply and exhaust of gas into and out of the chamber 161 start. When the valve 84 is opened, nitrogen gas is supplied through the gas supply opening 81 into the heat treatment space 65. When the valve 89 is opened, the gas within the chamber 161 is exhausted through the gas exhaust opening 86. This causes the nitrogen gas supplied from an upper portion of the heat treatment space 65 in the chamber 161 to flow downwardly and then to be exhausted from a lower portion of the heat treatment space 65.

The gas within the chamber 161 is exhausted also through the transport opening 66 by opening the valve 192. Further, the exhaust mechanism not shown exhausts an atmosphere around the drivers of the transfer mechanism 10. It should be noted that the nitrogen gas is continuously supplied into the heat treatment space 65 during the heat treatment of a semiconductor wafer W in the heat treatment apparatus 160. The amount of nitrogen gas supplied into the heat treatment space 65 is changed as appropriate in accordance with process steps.

Subsequently, the gate valve 162 is opened to open the transport opening 66. A transport robot outside the heat treatment apparatus 160 transports a semiconductor wafer W to be treated through the transport opening 66 into the heat treatment space 65 of the chamber 161. At this time, there is a danger that an atmosphere outside the heat treatment apparatus 160 is carried into the heat treatment space 65 as the semiconductor wafer W is transported into the heat treatment space 65. However, the nitrogen gas is continuously supplied into the chamber 161. Thus, the nitrogen gas flows outwardly through the transport opening 66 to minimize the outside atmosphere carried into the heat treatment space 65.

The semiconductor wafer W transported into the heat treatment space 65 by the transport robot is moved forward to a position lying immediately over the holder 7 and is stopped thereat. Then, the pair of transfer arms 11 of the transfer mechanism 10 is moved horizontally from the retracted position to the transfer operation position and is then moved upwardly, whereby the lift pins 12 pass through the through holes 79 and protrude from the upper surface of the holding plate 75 of the susceptor 74 to receive the semiconductor wafer W. At this time, the lift pins 12 move upwardly to above the upper ends of the support pins 77.

After the semiconductor wafer W is placed on the lift pins 12, the transport robot moves out of the heat treatment space 65, and the gate valve 162 closes the transport opening 66. Then, the pair of transfer arms 11 moves downwardly to transfer the semiconductor wafer W from the transfer mechanism 10 to the susceptor 74 of the holder 7, so that the semiconductor wafer W is held in a horizontal attitude from below. The semiconductor wafer W is supported by the support pins 77 provided upright on the holding plate 75, and is held by the susceptor 74. The semiconductor wafer W is held by the holder 7 in such an attitude that the front surface thereof that is a surface to be treated is the upper surface. A predetermined distance is defined between a back surface (a main surface opposite from the front surface) of the semiconductor wafer W supported by the support pins 77 and the holding surface 75a of the holding plate 75. The pair of transfer arms 11 moved downwardly below the susceptor 74 is moved back to the retracted position, i.e. to the inside of the recessed portion 62, by the horizontal movement mechanism 13.

After the semiconductor wafer W is held from below in a horizontal attitude by the susceptor 74 of the holder 7 made of quartz, the 40 halogen lamps HL in the halogen heating part 4 turn on simultaneously to start preheating (or assist-heating). Halogen light emitted from the halogen lamps HL is transmitted through the lower chamber window 64 and the susceptor 74 both made of quartz, and impinges upon the lower surface of the semiconductor wafer W. By receiving light irradiation from the halogen lamps HL, the semiconductor wafer W is preheated, so that the temperature of the semiconductor wafer W increases. It should be noted that the transfer arms 11 of the transfer mechanism 10, which are retracted to the inside of the recessed portion 62, do not become an obstacle to the heating using the halogen lamps HL.

The temperature of the semiconductor wafer W which is on the increase by the irradiation with light from the halogen lamps HL is measured by the lower radiation thermometer 20. The measured temperature of the semiconductor wafer W is transmitted to the controller 3. The controller 3 controls the output from the halogen lamps HL while monitoring whether the temperature of the semiconductor wafer W which is on the increase by the irradiation with light from the halogen lamps HL reaches a predetermined preheating temperature T1 (with reference to FIG. 9) or not. In other words, the controller 3 effects feedback control of the output from the halogen lamps HL so that the temperature of the semiconductor wafer W is equal to the preheating temperature T1, based on the value measured by the lower radiation thermometer 20.

After the temperature of the semiconductor wafer W reaches the preheating temperature T1, the controller 3 maintains the temperature of the semiconductor wafer W at the preheating temperature T1 for a short time. Specifically, at the point in time when the temperature of the semiconductor wafer W measured by the lower radiation thermometer 20 reaches the preheating temperature T1, the controller 3 adjusts the output from the halogen lamps HL to maintain the temperature of the semiconductor wafer W at approximately the preheating temperature T1.

By performing such preheating using the halogen lamps HL, the temperature of the entire semiconductor wafer W is uniformly increased to the preheating temperature T1. In the stage of preheating using the halogen lamps HL, the semiconductor wafer W shows a tendency to be lower in temperature in a peripheral portion thereof where heat dissipation is liable to occur than in a central portion thereof. However, the halogen lamps HL in the halogen heating part 4 are disposed at a higher density in the region opposed to the peripheral portion of the semiconductor wafer W than in the region opposed to the central portion thereof. This causes a greater amount of light to impinge upon the peripheral portion of the semiconductor wafer W where heat dissipation is liable to occur, thereby providing a uniform in-plane temperature distribution of the semiconductor wafer W in the stage of preheating.

The flash lamps FL in the flash heating part 5 irradiate the front surface of the semiconductor wafer W held by the susceptor 74 with a flash of light at the point in time when a predetermined time period has elapsed since the temperature of the semiconductor wafer W reached the preheating temperature T1. At this time, part of the flash of light emitted from the flash lamps FL travels directly toward the interior of the chamber 161. The remainder of the flash of light is reflected once from the reflector 52, and then travels toward the interior of the chamber 161. The irradiation of the semiconductor wafer W with such flashes of light achieves the flash heating of the semiconductor wafer W.

The flash heating, which is achieved by the emission of a flash of light from the flash lamps FL, is capable of increasing the front surface temperature of the semiconductor wafer W in a short time. Specifically, the flash of light emitted from the flash lamps FL is an intense flash of light emitted for an extremely short period of time ranging from about 0.1 to about 100 milliseconds as a result of the conversion of the electrostatic energy previously stored in the capacitor into such an ultrashort light pulse. The front surface temperature of the semiconductor wafer W subjected to the flash heating by the flash irradiation from the flash lamps FL momentarily increases to a treatment temperature of 1000° C. or higher, and thereafter decreases rapidly.

After a predetermined time period has elapsed since the completion of the flash heating treatment, the halogen lamps HL turn off. This causes the temperature of the semiconductor wafer W to decrease rapidly from the preheating temperature T1. The lower radiation thermometer 20 measures the temperature of the semiconductor wafer W which is on the decrease. The result of measurement is transmitted to the controller 3. The controller 3 monitors whether the temperature of the semiconductor wafer W is decreased to a predetermined temperature or not, based on the result of measurement by means of the lower radiation thermometer 20. After the temperature of the semiconductor wafer W is decreased to the predetermined temperature or below, the pair of transfer arms 11 of the transfer mechanism 10 is moved horizontally again from the retracted position to the transfer operation position and is then moved upwardly, so that the lift pins 12 protrude from the upper surface of the susceptor 74 to receive the heat-treated semiconductor wafer W from the susceptor 74. Subsequently, the transport opening 66 which has been closed is opened by the gate valve 162, and the transport robot outside the heat treatment apparatus 160 transports the semiconductor wafer W placed on the lift pins 12 out of the chamber 161. Thus, the heating treatment of the semiconductor wafer W is completed.

<Configuration of Abnormality Detection Device 2>

FIG. 8 is a functional block diagram schematically showing an electrical configuration of the heat treatment apparatus 160 including the abnormality detection device 2. The heat treatment apparatus 160 includes the controller 3, an input part 15, and a display part 16. The controller 3 includes an arithmetic processor such as a CPU. The controller 3 further includes the abnormality detection device 2. The controller 3 controls, for example, the flash heating part 5 and the halogen heating part 4. The input part 15 includes an input device such as a keyboard, a pointing device, and a touch panel. The input part 15 further includes a communication module for communication with a host computer. The display part 16 includes, for example, a liquid crystal display, and displays various pieces of information under the control of the controller 3.

The CPU in the controller 3 executes a predetermined processing program, whereby the processes in the heat treatment apparatus 160 proceed. For example, the controller 3 controls the halogen heating part 4 and the flash heating part 5 to heat-treat the semiconductor wafer W to a set temperature. The controller 3 further includes a storage part 31, an arithmetic part 32, and an alarm issuing part 33. The storage part 31 includes a storage device such as a solid-state memory device and a hard disk drive. The arithmetic part 32 includes a relationship information analysis part 32a, a learning model creation part 32b, and a detection part 32c, which will be described in detail later. The learning model creation part 32b, the detection part 32c, and the alarm issuing part 33 are included in the abnormality detection device 2. The relationship information analysis part 32a, the learning model creation part 32b, the detection part 32c, and the alarm issuing part 33 are functional processing parts implemented by the CPU of the controller 3 executing a predetermined processing program. The details on the processing in the relationship information analysis part 32a, the learning model creation part 32b, the detection part 32c, and the alarm issuing part 33 will be further described later.

Referring again to FIG. 1, the upper radiation thermometer 25 includes the infrared sensor 29 for measuring the temperature of the upper surface (front surface) of the semiconductor wafer W. The infrared sensor 29 transmits a detection signal generated in response to the reception of light to the controller 3, and the temperature of the upper surface of the semiconductor wafer W is calculated in the controller 3. Similarly, the lower radiation thermometer 20 includes the infrared sensor 24 for measuring the temperature of the lower surface (back surface) of the semiconductor wafer W. The infrared sensor 24 transmits a detection signal generated in response to the reception of light to the controller 3, and the temperature of the lower surface of the semiconductor wafer W is calculated in the controller 3.

The controller 3 of the heat treatment apparatus 160 acquires a plurality of pieces of treatment information having a correlation with the temperature of the semiconductor wafer W in addition to the temperature of the semiconductor wafer W. Examples of the treatment information include the temperature of the quartz components in the chamber 161 (e.g., the temperature of the susceptor 74, the temperature of the upper chamber window 63, and the temperature of the lower chamber window 64), the temperature of the wall surfaces of the chamber 161, the amount of electric power supplied to the halogen heating part 4 (or each of the halogen lamps HL), the amount of light emitted from the halogen heating part 4 (or each of the halogen lamps HL), the amount of treatment gas supplied to the interior of the chamber 161, and the amount of light emitted from the flash heating part 5 (or each of the flash lamps FL).

These pieces of treatment information are acquired by sensors S1 to S9 serving as a treatment information acquisition part 90. For example, the temperature of the susceptor 74 is acquired by the temperature sensor 91 (FIG. 1) (the sensor S1 in FIG. 8); the temperature of the upper chamber window 63 is acquired by the temperature sensor 92 (FIG. 1) (the sensor S2 in FIG. 8); the temperature of the lower chamber window 64 is acquired by the temperature sensor 93 (FIG. 1) (the sensor S3 in FIG. 8); the temperature of the atmosphere in the chamber 161 is acquired by the temperature sensor 94 (FIG. 1) (the sensor S4 in FIG. 8); and the temperature of the wall surfaces of the chamber 161 is acquired by the temperature sensor 95 (FIG. 1) (the sensor S5 in FIG. 8). The amount of electric power supplied to the halogen heating part 4 (or each of the halogen lamps HL) is acquired by an ammeter 49*a* connected to the electric power supply part 49 (FIG. 1) (the sensor S6 in FIG. 8). The amount of light emitted from the halogen heating part 4 (or each of the halogen lamps HL) is acquired by the light amount sensor 97 (FIG. 1) (the sensor S7 in FIG. 8). The amount of treatment gas supplied to the interior of the chamber 161 is acquired by the flowmeter 98 connected to the gas supply pipe 83 (FIG. 1) (the sensor S8 in FIG. 8). The amount of light emitted from the flash heating part 5 (or each of the flash lamps FL) is acquired by the light amount sensor 96 (FIG. 1) (the sensor S9 in FIG. 8). Such information is also usable as treatment information for creation of learning models. Preferably, the treatment information acquired by the sensors S1 to S9 serving as the treatment information acquisition part 90 includes at least two parameters selected from the above. Other information may be employed as the treatment information as long as the information has a correlation with the temperature of the semiconductor wafer W, and the aforementioned treatment information acquired by the sensors S1 to S9 may be excluded.

Whether the treatment information has a correlation with the temperature of the semiconductor wafer W or not is judged by the relationship information analysis part 32*a* which analyzes a relationship between the temperature of the semiconductor wafer W and the treatment information. The relationship information analysis part 32*a* judges whether the information acquired from each of the sensors has a correlation with the temperature of the semiconductor wafer W or not and whether the correlation is high or low. The information judged to have a high correlation with the temperature of the semiconductor wafer W in the relationship information analysis part 32*a* is employed as the treatment information in the learning model creation part 32*b*. On the other hand, the treatment information judged to have a low or no correlation with the temperature of the semiconductor wafer W may be excluded from the treatment information in the learning model creation part 32*b*.

In the present preferred embodiment, the learning model creation part 32*b* creates learning models each representing a relationship between the temperature of the semiconductor wafer W and the actual measured value (value outputted from each of the sensors) obtained by the treatment information acquisition part 90 (each of the sensors). For the creation of a learning model, learning data representing a relationship between the temperature of the semiconductor wafer W and each actual measured value is initially acquired based on the temperature of the semiconductor wafer W and the actual measured values obtained from at least two of the aforementioned sensors. Then, a weighting factor or the like of each actual measured value is optimized using the acquired learning data. In this manner, the learning model is created.

Figure 9:
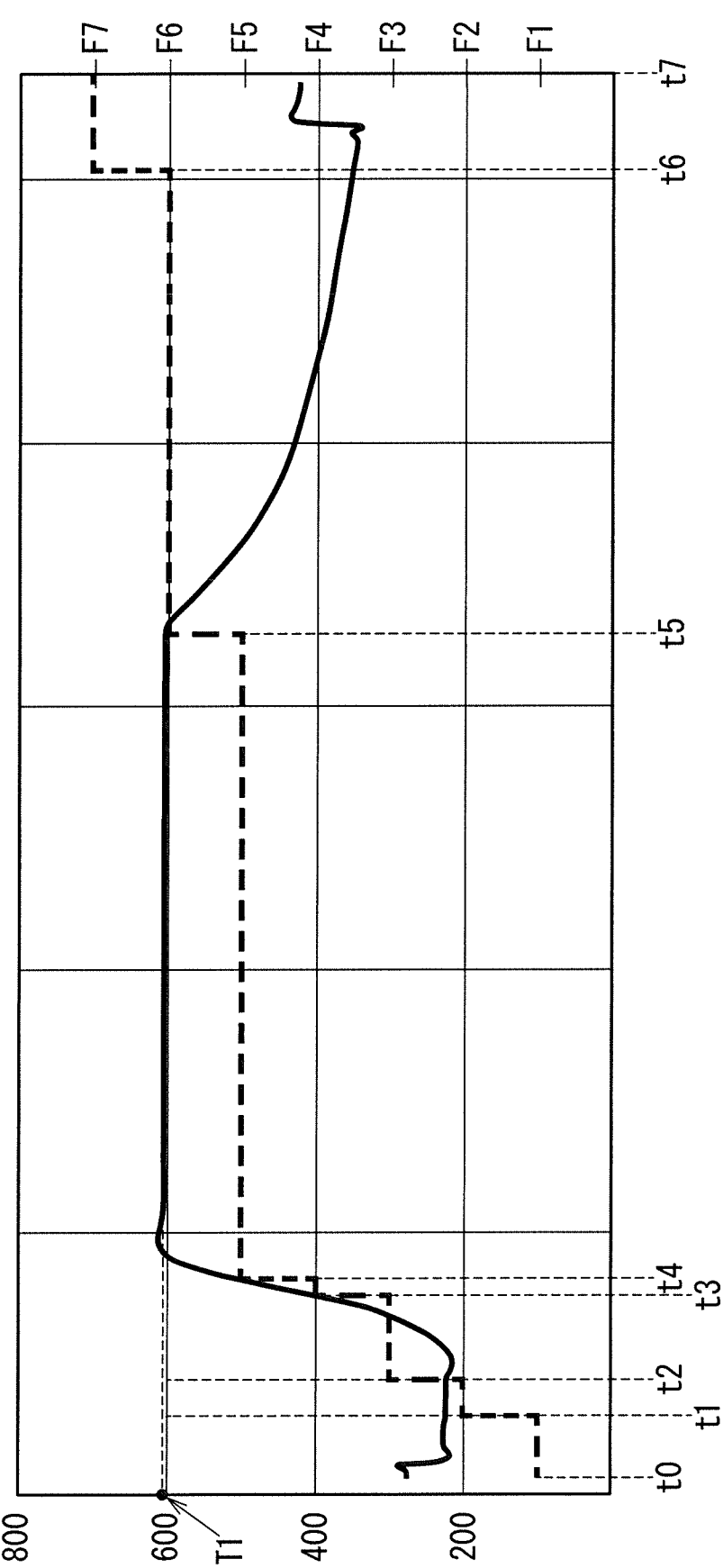
FIG. 9 is a graph showing phases for use during the creation of learning models in the first preferred embodiment.

FIG. 9 is a graph showing phases for use during the creation of the learning models in the present preferred embodiment. In FIG. 9, the abscissa represents time, one ordinate (left ordinate (data indicated by solid curves in the graph)) represents temperature, and the other ordinate (right ordinate (data indicated by dotted lines in the graph)) represents heat treatment phases.

When creating the learning models in the present preferred embodiment, the learning model creation part 32*b* divides the heat treatment of the semiconductor wafer W into a plurality of phases. The phases preferably include at least a phase in which the temperature of the semiconductor wafer W is increased by the halogen heating part 4, a phase in which the temperature of the semiconductor wafer W is maintained constant by the halogen heating part 4, and a phase in which the temperature of the semiconductor wafer W decreases after the completion of heating by means of the halogen heating part 4 and the flash heating part 5. This is because these heat treatment phases are considered to be characteristic phases in the quality control of the semiconductor wafer W. It should be noted that the temperature of the lower surface of the semiconductor wafer W is shown in FIG. 9, and the treatment information having a correlation with the temperature of the lower surface of the semiconductor wafer W is employed by the relationship information analysis part 32*a*.

In the present preferred embodiment, the heat treatment of the semiconductor wafer W is divided into the plurality of heat treatment phases indicated by the dotted lines in FIG. 9. In the present preferred embodiment, the division is made in accordance with different intensities of light from the halogen heating part 4. The heat treatment phases in the present preferred embodiment correspond to seven intervals. Specifically, the seven intervals in FIG. 9 are as follows: an interval between t0 and t1 (a heat treatment phase F1), an interval between t1 and t2 (a heat treatment phase F2), an interval between t2 and t3 (a heat treatment phase F3), an interval between t3 and t4 (a heat treatment phase F4), an interval between t4 and t5 (a heat treatment phase F5), an interval between t5 and t6 (a heat treatment phase F6), and an interval between t6 and t7 (a heat treatment phase F7). These heat treatment phases differ from each other in intensity of light from the halogen heating part 4 to be set, i.e., in amount of electric power (value indicated by the ammeter 49*a*) supplied from the electric power supply part 49 to the halogen heating part 4. The learning model creation part 32*b* creates a learning model for each of the phases as mentioned above. It should be noted that the division into the phases as mentioned above differ from one heat treatment recipe from another.

The detection part 32*c* detects a treatment abnormality in the semiconductor wafer W, based on the plurality of learning models created by the learning model creation part 32*b*. More specifically, the detection part 32*c* detects a treatment abnormality in the semiconductor wafer W, based on a difference between the actual measured value obtained from the treatment information acquisition part 90 (each of the sensors) and a predicted value calculated using the learning models. The detection part 32c makes a comparison between the predicted value obtained from the learning models and the actual measured values about the plurality of pieces of treatment information for each of the phases to detect a treatment abnormality. In this process, the magnitude of the difference between the actual measured value obtained from the treatment information acquisition part 90 (each of the sensors) and the predicted value calculated using the learning models is calculated as the degree of abnormality. The degree of abnormality is related to the magnitude of the correlation between the temperature of the semiconductor wafer W and the treatment information. When the correlation is high, the degree of abnormality is judged to be high even if the difference is small. When the correlation is low, the degree of abnormality is judged to be low even if the difference is large.

As described above, the detection part 32c detects a change in relationship between the temperature of the semiconductor wafer W and the actual measured value obtained from the treatment information acquisition part 90 (each of the sensors). Thus, a sign of failure of the heat treatment apparatus 160 is detected. Also, when the aforementioned actual measured value deviates from the predicted value obtained from the learning models by more than a predetermined threshold value, the detection part 32c judges that a treatment abnormality occurs.

The alarm issuing part 33 issues an alarm when the detection part 32c detects a treatment abnormality as mentioned above. The alarm issuing part 33 displays an alarm indicating the presence of failure or a sign of failure on the display part 16.

<Procedure for Creation of Learning Model in Abnormality Detection Device 2>

A procedure for the creation of a learning model and the detection of a treatment abnormality for the heat treatment apparatus 160 in the abnormality detection device 2 will be described below.

FIG. 10 is a flow diagram showing a procedure for the creation of the learning models by means of the abnormality detection device 2. FIG. 11 is a flow diagram showing a procedure for the detection of a treatment abnormality by means of the abnormality detection device 2.

For the creation of the learning models by means of the abnormality detection device 2, the temperature of the semiconductor wafer W serving as training data is initially measured (Step ST1), as shown in FIG. 10. The temperature measurement is performed on a plurality of semiconductor wafers W. Next, treatment information serving as training data is acquired by each of the sensors (the treatment information acquisition part 90) installed in heat treatment apparatus 160 (Step ST2) in the same manner as the temperature measurement. The acquisition of the treatment information is also performed in the treatment of the plurality of semiconductor wafers W.

The temperature data and the treatment information as the training data acquired in Steps ST1 and ST2 are divided in accordance with the heat treatment phases shown in FIG. 9 and stored in the storage part 31 (Step ST3). Next, the learning model creation part 32b creates a learning model for each of the aforementioned heat treatment phases F1 to F7, based on the temperature and the treatment information. The learning model of the temperature data divided for each of the heat treatment phases is created, and the learning model of the treatment information divided for each of the heat treatment phases is created (Step ST4).

The abnormality detection device 2 in the present preferred embodiment creates the learning model divided for each of the heat treatment phases as mentioned above, and is capable of making a comparison between the predicted value and the actual measured value for each of the heat treatment phases. In the heat treatment of the semiconductor wafer W, it is considered that a different relationship between the temperature of the semiconductor wafer W and another piece of treatment information is established in each of the heat treatment phases with different properties. When the relationship different for each of the heat treatment phases is grasped under these conditions, a slight change in the heat treatment is detectable. Thus, the abnormality detection device 2 in the present preferred embodiment is capable of detection of a treatment abnormality with small changes which has been difficult in the conventional techniques. For example, the abnormality detection device 2 is capable of detecting a decrease in output from one lamp in a heat source for heating a substrate. In addition, the abnormality detection device 2 is capable of differentiating between noise and a change of some degrees in substrate temperature or a change of several percent in lamp output. From the above, the abnormality detection device 2 in the present preferred embodiment is capable of detecting a small treatment abnormality and of detecting a sign of failure of the entire heat treatment apparatus by detecting the small treatment abnormality, as compared with an instance in which a learning model is created for the entire heat treatment of the semiconductor wafer W.

Next, for the detection of a treatment abnormality by means of the abnormality detection device 2, the temperature of the semiconductor wafer W to be treated is initially measured (Step ST11). Next, each of the sensors (the treatment information acquisition part 90) acquires the treatment information (Step ST12).

The temperature data and the treatment information about the semiconductor wafer W acquired in Steps ST11 and ST12 are divided in accordance with the heat treatment phases (the heat treatment phases F1 to F7) shown in FIG. 9 and stored in the storage part 31 (Step ST13). The temperature data and the treatment information which are stored in the storage part 31 are used as actually measured values in processes to be described below.

Next, the predicted values of the learning models about the temperature of the semiconductor wafer W and the treatment information are calculated by the arithmetic part 32 (Step ST14). The actual measured values stored in Step ST13 are compared with the predicted values thus calculated (Step ST15). In other words, the abnormality detection device 2 compares the actual measured value about the plurality of pieces of treatment information with the predicted value determined from the learning models for each of the pieces of treatment information and for each of the heat treatment phases (the heat treatment phases F1 to F7).

A judgment is made as to whether the difference between the predicted and actual measured values compared in Step ST15 is less than a previously set threshold value or not (Step ST16). The threshold value is set for each of the pieces of treatment information and for each of the heat treatment phases. This threshold value may be calculated during the creation of the learning models. If the difference between the predicted and actual measured values is judged to be less than the threshold value in Step ST16, it is judged that no treatment abnormalities occur (Step S17). If it is judged that no treatment abnormalities occur, the treatment of the next semiconductor wafer W is performed.

On the other hand, if the difference between the predicted and actual measured values is judged to be not less than the threshold value in Step ST16, it is judged that a treatment abnormality occurs (Step S18). The judgment is made that a treatment abnormality occurs when the difference is not less than the threshold value in at least one of the pieces of treatment information in at least one of the heat treatment phases. When the difference is not less than the threshold value in at least one of the pieces of treatment information in at least one of the heat treatment phases, it is judged that a correlation between the temperature and the treatment information is destroyed. The magnitude of destruction of the correlation is evaluated at the same time. The magnitude of destruction is evaluated by the ratio between the number of effective correlations in the learning models calculated in the relationship information analysis part 32a and the number of correlations in the actual measured values. Thus, when the value of the number of effective correlations in the learning models is low (in the case of treatment information judged to have a lower correlation), it is not judged in some cases that an abnormality occurs even if there is a change in the number of correlations in the actual measured values.

If it is judged that a treatment abnormality occurs in Step S18, an alarm is issued by the alarm issuing part 33 of the abnormality detection device 2 (Step ST19). The greater the magnitude of destruction is, the stronger the alarm may be. A strong alarm may also be issued if it is judged that treatment abnormalities occur consecutively in a plurality of pieces of treatment information in a plurality of heat treatment phases. The alarm is issued, for example, by the alarm issuing part 33 indicating the presence of failure or a sign of failure on the display part 16. Upon the issue of the alarm, the treatment of the semiconductor wafer W may be stopped.

The abnormality detection device 2 compares the actual measured values related to the plurality of pieces of treatment information with the predicted values obtained from the learning models in each of the phases to detect a treatment abnormality as described above.

Second Preferred Embodiment

Next, a second preferred embodiment of the present invention will be described. A heat treatment apparatus 260 of the second preferred embodiment is similar to the heat treatment apparatus 160 of the first preferred embodiment in configuration and in procedure for the treatment of the semiconductor wafer W. The second preferred embodiment has an electrical configuration similar to that of the first preferred embodiment, as shown in FIG. 8. A controller 203 includes the storage part 31, an arithmetic part 232, and the alarm issuing part 33. The arithmetic part 232 includes the relationship information analysis part 32a, a learning model creation part 232b, and the detection part 32c. The learning model creation part 232b, the detection part 32c, and the alarm issuing part 33 are included in an abnormality detection device 202.

Figure 12:
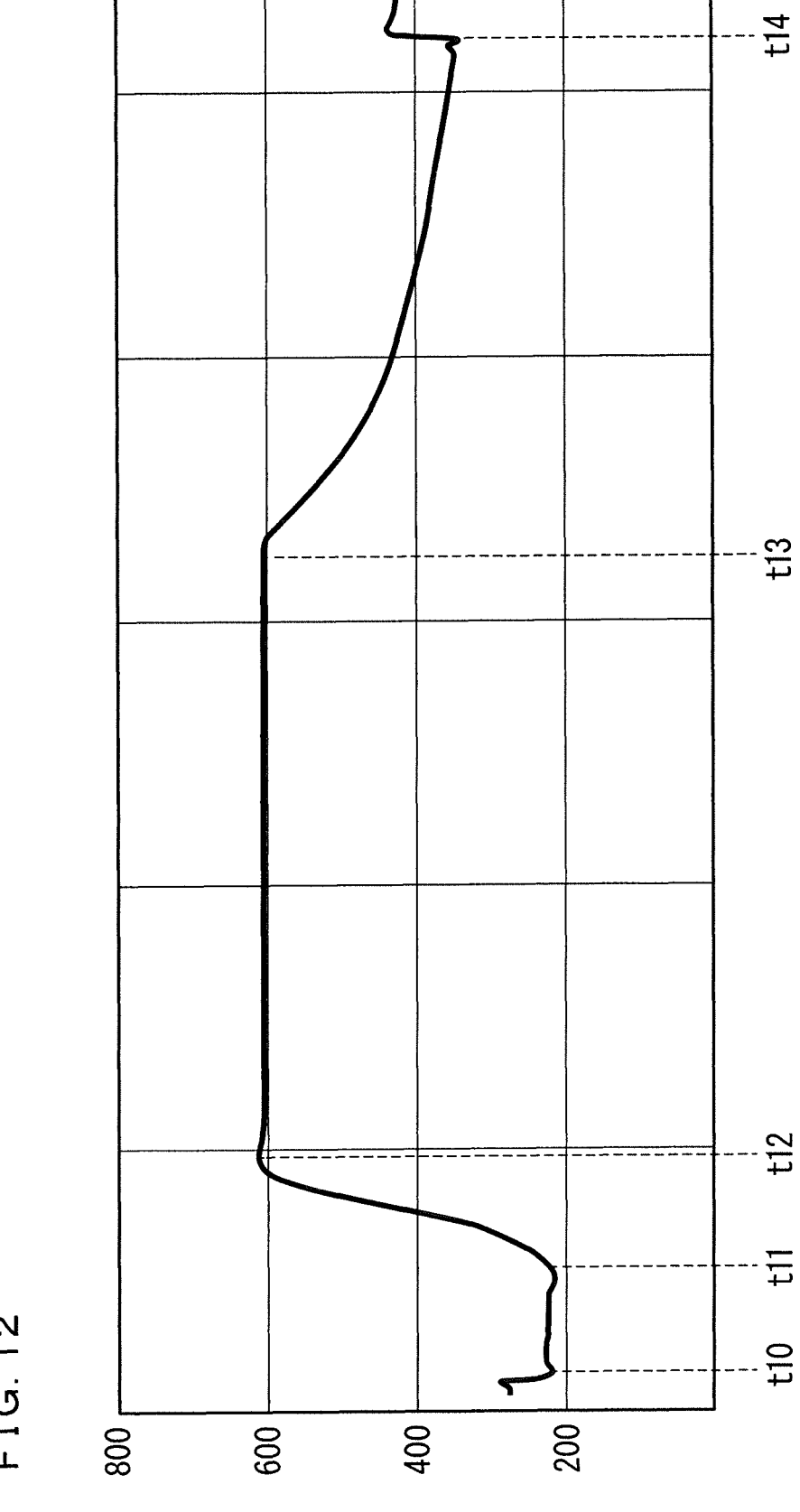
FIG. 12 is a graph showing phases for use during the creating learning models in a second preferred embodiment.

FIG. 12 is a graph showing phases for use during the creation of the learning models in the second preferred embodiment. In FIG. 12, the abscissa represents time, and the ordinate (left side (data indicated by solid curves in the graph)) represents temperature.

When creating the learning models in the second preferred embodiment, the learning model creation part 232b divides the heat treatment of the semiconductor wafer W into a plurality of phases. In the second preferred embodiment, the heat treatment of the semiconductor wafer W is divided into the plurality of heat treatment phases separated by times indicated by t10 to t14 in FIG. 12.

Although the division into the heat treatment phases is made in accordance with different intensities of light from the halogen heating part 4 in the first preferred embodiment, the division into the heat treatment phases is made in accordance with the temperature ranges of the lower surface of the semiconductor wafer W in the second preferred embodiment. In the second preferred embodiment, the division is made in accordance with different intensities of light from the halogen heating part 4. The heat treatment phases in the second preferred embodiment correspond to four intervals. Specifically, the four intervals in FIG. 12 are as follows: an interval between t10 and t11 (a heat treatment phase F11), an interval between t11 and t12 (a heat treatment phase F12), an interval between t12 and t13 (a heat treatment phase F13), and an interval between t13 and t14 (a heat treatment phase F14). These heat treatment phases differ from each other in the range of temperature measured by the lower radiation thermometer 20. For example, the heat treatment phase F11 corresponds to the interval between the start of heating by means of the halogen heating part 4 and the start of the increase in temperature of the semiconductor wafer W; the heat treatment phase F12 corresponds to the interval during which the temperature of the semiconductor wafer W is increased to the preheating temperature T1 by the halogen heating part 4 (the interval during which the halogen heating part 4 increases the temperature); the heat treatment phase F13 corresponds to the interval during which the semiconductor wafer W is maintained constant at the preheating temperature T1 by heating using the halogen heating part 4; and the heat treatment phase F14 corresponds to the interval during which the temperature of the semiconductor wafer W is decreased by the decrease in output from the halogen heating part 4 after the completion of the flash heating part 5 (the interval during which the temperature of the semiconductor wafer W decreases after the completion of the heating by means of the halogen heating part 4 and the flash heating part 5).

In the second preferred embodiment, the acquired temperature data and treatment information about the semiconductor wafer W are divided in accordance with the heat treatment phases (the heat treatment phases F11 to F14) shown in FIG. 12 and stored in the storage part 31. Then, the abnormality detection device 202 in the second preferred embodiment compares the actual measured value about the plurality of pieces of treatment information with the predicted value determined from the learning models for each of the pieces of treatment information and for each of the heat treatment phases (the heat treatment phases F11 to F14).

Effects Produced by Aforementioned Preferred Embodiments

The following are examples of the effects produced by the aforementioned preferred embodiments. In the following description, the effects will be described based on the specific configurations exemplified in the aforementioned preferred embodiments. However, these specific configurations may be replaced with other specific configurations exemplified herein to the extent that similar effects are produced.

The replacement may be performed over at least two of the preferred embodiments. That is, the configurations exemplified in different ones of the preferred embodiments may be combined together to produce similar effects.

The abnormality detection device 2 (202) of the preferred embodiments described above is the abnormality detection device 2 (202) for detecting a treatment abnormality in the semiconductor wafer W to be heat-treated in the heat treatment apparatus 160. The abnormality detection device 2

(202) includes the lower radiation thermometer 20 for measuring the temperature of the semiconductor wafer W being heat-treated, the treatment information acquisition part 90 (the sensors) for acquiring the plurality of pieces of treatment information having a correlation with the temperature measured by the lower radiation thermometer 20, and the detection part 32c for dividing the heat treatment of the semiconductor wafer W into the plurality of phases (the heat treatment phases F1 to F7 or the heat treatment phases F11 to F14) to detect a treatment abnormality in the semiconductor wafer W, based on the plurality of learning models created for the respective phases (the heat treatment phases F1 to F7 or the heat treatment phases F11 to F14), based on the temperature and the treatment information.

With such a configuration, a treatment abnormality in the semiconductor wafer W is detected based on the plurality of learning models created for the respective phases (the heat treatment phases F1 to F7 or the heat treatment phases F11 to F14). This allows the detection of a small treatment abnormality and the detection of a sign of failure of the entire heat treatment apparatus 160 (260) by the detection of the small treatment abnormality, as compared with an instance in which an abnormality is detected based on a learning model created without the division into the plurality of phases.

The heat treatment apparatus 160 (260) includes: the chamber 161 for receiving the semiconductor wafer W therein; the halogen heating part 4 for irradiating the semiconductor wafer W received in the chamber 161 with light to preheat the semiconductor wafer W; and the flash heating part 5 for irradiating the semiconductor wafer W with light to cause the temperature of the semiconductor wafer W to reach the treatment temperature. The pieces of treatment information include at least two parameters selected from the group consisting of: the temperature of the quartz components in the chamber 161 (e.g., the temperature of the susceptor 74, the temperature of the upper chamber window 63, and the temperature of the lower chamber window 64), the temperature of the wall surfaces of the chamber 161, electric power supplied to the halogen heating part 4, the intensity of light from the halogen heating part 4, and the amount of treatment gas supplied to the interior of the chamber 161.

With such a configuration, the accuracy of the detection of treatment abnormalities is improved because the pieces of treatment information include at least two parameters considered to be highly correlated with the temperature of the semiconductor wafer W.

The phases (heat treatment phases) include at least the phase (the heat treatment phase F12 in the second preferred embodiment) in which the temperature of the semiconductor wafer W is increased by the halogen heating part 4, the phase (the heat treatment phase F13 in the second preferred embodiment) in which the temperature of the semiconductor wafer W is maintained constant by the halogen heating part 4, and the phase (the heat treatment phase F14 in the second preferred embodiment) in which the temperature of the semiconductor wafer W decreases after the completion of heating by means of the halogen heating part 4 and the flash heating part 5.

With such a configuration, the accuracy of the detection of treatment abnormalities is improved because the learning model is created for each of the heat treatment phases considered to be characteristic phases in the quality control of the semiconductor wafer W.

The detection part 32c detects a treatment abnormality by making a comparison between the predicted value obtained from the learning models and the actual measured value about the plurality of pieces of treatment information (e.g., the temperature of the quartz components in the chamber 161, the temperature of the wall surfaces of the chamber 161, the electric power supplied to the halogen heating part 4, the intensity of light from the halogen heating part 4, and the amount of treatment gas supplied to the interior of the chamber 161) for each of the phases (the heat treatment phases F1 to F7 or the heat treatment phases F11 to F14).

With such a configuration, whether the degree of abnormality is high or low is judged by the magnitude of the correlation between the temperature of the semiconductor wafer W and the treatment information. Thus, the accuracy of the detection of treatment abnormalities is improved.

Also, when the actual measured value deviates from the predicted value obtained from the learning models by more than a predetermined threshold value, the detection part 32c judges that a treatment abnormality occurs.

The abnormality detection device 2 (202) further includes the alarm issuing part 33 for issuing an alarm when the detection part 32c detects a treatment abnormality.

Such a configuration allows an operator of the heat treatment apparatus 160 (260) to smoothly detect a treatment abnormality.

Modifications of Aforementioned Preferred Embodiments

The material properties, materials, dimensions, shapes, and relative positional relationship of the components or conditions for implementation are described in some cases in the aforementioned preferred embodiments. These are, however, merely examples in all aspects and shall not be limited to those described in the present invention.

Thus, numerous unillustrative modifications and equivalents can be devised within the technical scope disclosed in the present invention. Examples of these shall include an instance where at least one component is modified, added or dispensed with and an instance where at least one component in at least one preferred embodiment is extracted and combined with a component in another preferred embodiment.

The arithmetic part 32 (232) includes the relationship information analysis part 32a and the learning model creation part 32b (232b) in the aforementioned preferred embodiments, but is not limited to this. The arithmetic part 32 (232) need not necessarily include the relationship information analysis part 32a. Instead, previously analyzed (or set) relationships between the temperature of the semiconductor wafer W and the treatment information may be stored in the storage part 31. Also, the arithmetic part 32 (232) need not necessarily include the learning model creation part 32b. Instead, previously created learning models may be stored in the storage part 31. Based on the stored learning models, the arithmetic part 32 (232) may calculate the predicted values.

Similarly, the abnormality detection device 2 (202) includes the learning model creation part 32b (232b) in the aforementioned preferred embodiments, but is not limited to this. The abnormality detection device 2 (202) need not necessarily include the learning model creation part 32b (232b). Instead, previously created learning models may be stored in the storage part 31. Based on the stored learning models, the abnormality detection device 2 (202) may detect a treatment abnormality in the semiconductor wafer W.

The arithmetic part 32 (232) (the abnormality detection device 2 (202)) includes the detection part 32c in the aforementioned preferred embodiments, but is not limited to this. The arithmetic part 32 (232) (the abnormality detection device 2 (202)) need not necessarily include the detection part 32*c*. Instead, the function of the detection part 32*c* may be provided in the cloud that is remotely accessible with the heat treatment apparatus 160 (260). In this case, the actual measured values obtained by the treatment information acquisition part 90 (each of the sensors) and the values measured by the lower radiation thermometer 20 (and/or the upper radiation thermometer 25) may be transmitted to the cloud and calculated in the cloud, and the controller 3 (203) then may receive the results of the treatment abnormality. In this case, the actual measured values obtained by the treatment information acquisition part 90 (each of the sensors) and the values measured by the lower radiation thermometer 20 (and/or the upper radiation thermometer 25) may be stored in the cloud. Also, the entire functions of the controller 3 (203) may be provided in the cloud. Further, the function of the detection part 32*c* accessible with (transmissible to and receivable from) the heat treatment apparatus 160 (260) by wired or wireless means may be provided in other than the cloud.

In the aforementioned preferred embodiments, the pieces of treatment information having a correlation with the temperature of the semiconductor wafer W measured by the lower radiation thermometer 20 are employed for the creation of the learning models. The treatment information, however, is not limited to such pieces of treatment information. A plurality of pieces of treatment information having a correlation with the temperature of the upper surface of the semiconductor wafer W measured by the upper radiation thermometer 25 may be employed for the creation of the learning models. In this case, the learning models are created based on the temperature of the upper surface of the semiconductor wafer W and the treatment information. This allows a treatment abnormality in the semiconductor wafer W to be detected even during periods (e.g., during soaking) over which the state of the heat treatment apparatus 160 (260) is stable and the influence of noise is considered to be small, as compared with other periods.

Also, a plurality of pieces of treatment information having a correlation with the temperatures of the lower and upper surfaces of the semiconductor wafer W measured by the lower and upper radiation thermometers 20 and 25 may be employed for the creation of the learning models.

When referred to without being particularly specified in the aforementioned preferred embodiments, a material shall contain another additive, e.g. an alloy, so long as no inconsistencies arise.

While the invention has been described in detail, the foregoing description is in all aspects illustrative and not restrictive. It is understood that numerous other modifications and variations can be devised without departing from the scope of the invention.

What is claimed is:

1. A heat treatment apparatus irradiating a substrate with light to heat the substrate, comprising:
   - a chamber for receiving said substrate therein with an upper chamber window and a lower chamber window made of quartz;
   - a susceptor made of quartz for supporting said substrate in said chamber;
   - a continuous lighting lamp irradiating said substrate supported by said susceptor with light to preheat said substrate;
   - a flash lamp irradiating a front surface of said substrate which has been preheated with flash of light;
   - a gas supply part supplying treatment gas in said chamber;
   - a thermometer for measuring a temperature of said substrate being heat-treated;
   - a plurality of sensors for acquiring a plurality of pieces of treatment information having a correlation with the temperature of said substrate measured by said thermometer, the plurality of pieces of treatment information including at least two parameters selected from the group consisting of: a temperature of said susceptor, a temperature of said upper chamber window, a temperature of said lower chamber window, a temperature of atmosphere in said chamber, a temperature of a wall surface of said chamber, an electric power amount supplied to said continuous lighting lamp, an amount of light from said continuous lighting lamp, a flow amount of the treatment gas supplied to said chamber; and an amount of flash of light from said flash lamp;
   - a learning device for dividing heat treatment of said substrate into a plurality of phases and creating a learning model for said respective phases based on said temperature of said substrate and said plurality of pieces of treatment information; and
   - a detection part determining whether there is an abnormality in a treatment on said substrate when a difference between an actual measured value measured by said plurality of sensors and a predicted value obtained from the learning model is equal to or larger than a predetermined threshold value.

2. The heat treatment apparatus according to claim 1, wherein said plurality of phases include at least a phase in which the temperature of said substrate is increased by said continuous lighting lamp, a phase in which the temperature of said substrate is maintained constant by said continuous lighting lamp, and a phase in which the temperature of said substrate decreases after the completion of heating by means of said continuous lighting lamp and said flash lamp.

3. The heat treatment apparatus according to claim 1, further comprising:
   - an alarm issuing part for issuing an alarm when said detection part detects a treatment abnormality.

\* \* \* \* \*